(12) United States Patent
Lee

(10) Patent No.: US 11,762,734 B2
(45) Date of Patent: Sep. 19, 2023

(54) APPARATUS AND METHOD FOR HANDLING A DATA ERROR IN A MEMORY SYSTEM

(71) Applicant: SK hynix Inc., Icheon-si (KR)

(72) Inventor: Jaeyoon Lee, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 120 days.

(21) Appl. No.: 16/915,407

(22) Filed: Jun. 29, 2020

(65) Prior Publication Data
US 2021/0224151 A1    Jul. 22, 2021

(30) Foreign Application Priority Data

Jan. 17, 2020    (KR) ................. 10-2020-0006490

(51) Int. Cl.
| | |
|---|---|
| *G06F 11/10* | (2006.01) |
| *G06F 11/14* | (2006.01) |
| *G06F 11/07* | (2006.01) |
| *H03M 13/39* | (2006.01) |
| *H03M 13/11* | (2006.01) |
| *G06F 11/30* | (2006.01) |

(52) U.S. Cl.
CPC ........ *G06F 11/1068* (2013.01); *G06F 11/076* (2013.01); *G06F 11/1489* (2013.01); *G06F 11/3037* (2013.01); *H03M 13/1108* (2013.01); *H03M 13/1111* (2013.01); *H03M 13/3933* (2013.01)

(58) Field of Classification Search
CPC ............... G06F 11/1068; G06F 11/076; G06F 11/1489; G06F 11/3037; G06F 11/1012; G06F 11/3034; G06F 11/3062; G06F 11/1441; G06F 11/0727; G06F 3/0604; G06F 3/0655; G06F 3/0688; H03M 13/1108; H03M 13/1111; H03M 13/3933; H03M 13/1102; H03M 13/1154; H03M 13/1157; H03M 13/2957; H03M 13/2963; H03M 13/3707; H03M 13/3738; H03M 13/6325; G11C 29/021; G11C 29/028; G11C 16/26; G11C 16/30; G11C 29/52
USPC .......................................................... 714/764
See application file for complete search history.

(56) References Cited

U.S. PATENT DOCUMENTS

| | | | |
|---|---|---|---|
| 9,509,342 B2 | 11/2016 | Vernon | |
| 10,339,991 B2 | 7/2019 | Lo | |
| 2009/0177931 A1* | 7/2009 | Song | ................ G06F 11/141 |
| | | | 714/E11.005 |
| 2015/0243363 A1* | 8/2015 | Wu | ................ G06F 11/1048 |
| | | | 365/185.18 |

(Continued)

FOREIGN PATENT DOCUMENTS

KR    1020180042974 A    4/2018

*Primary Examiner* — James C Kerveros
(74) *Attorney, Agent, or Firm* — WILLIAM PARK & ASSOCIATES LTD.

(57) ABSTRACT

A memory system includes a memory device and a controller. The memory device is configured to supply a read voltage into a plurality of non-volatile memory cells and transfer values obtained from the plural non-volatile memory cells. The controller is coupled to the memory device via at least one channel. The controller adjusts a level of the read voltage based on a cell difference probability (CDP) calculated from the values when a read operation to the plurality of non-volatile memory cells fails.

20 Claims, 10 Drawing Sheets

(56) References Cited

U.S. PATENT DOCUMENTS

2019/0042356 A1* 2/2019 Chen ................... G11C 16/26
2019/0149168 A1   5/2019 Chang et al.
2020/0104209 A1* 4/2020 El Gamal ............. G11C 16/26

* cited by examiner

APPARATUS AND METHOD FOR HANDLING A DATA ERROR IN A MEMORY SYSTEM

CROSS-REFERENCE TO RELATED APPLICATIONS

This patent application claims the benefit of Korean Patent Application No. 10-2020-0006490, filed on Jan. 17, 2020, the entire disclosure of which is incorporated herein by reference.

TECHNICAL FIELD

An embodiment of this disclosure relates to a memory system, and more particularly, to an apparatus and a method for handling a data error occurring in the memory system.

BACKGROUND

Recently, a paradigm for a computing environment has shifted to ubiquitous computing, which enables computer systems to be accessed virtually anytime and everywhere. As a result, the use of portable electronic devices, such as mobile phones, digital cameras, notebook computers, and the like, are rapidly increasing. Such portable electronic devices typically use or include a memory system that uses or embeds at least one memory device, i.e., a data storage device. The data storage device can be used as a main storage device or an auxiliary storage device of a portable electronic device.

Unlike a hard disk, a data storage device using a non-volatile semiconductor memory device is advantageous in that it has excellent stability and durability because it has no mechanical driving part (e.g., a mechanical arm), and has high data access speed and low power consumption. In the context of a memory system having such advantages, an exemplary data storage device includes a USB (Universal Serial Bus) memory device, a memory card having various interfaces, a solid state drive (SSD), or the like.

BRIEF DESCRIPTION OF THE DRAWINGS

The description herein makes reference to the accompanying drawings wherein like reference numerals refer to like parts throughout the figures.

Figure 1:
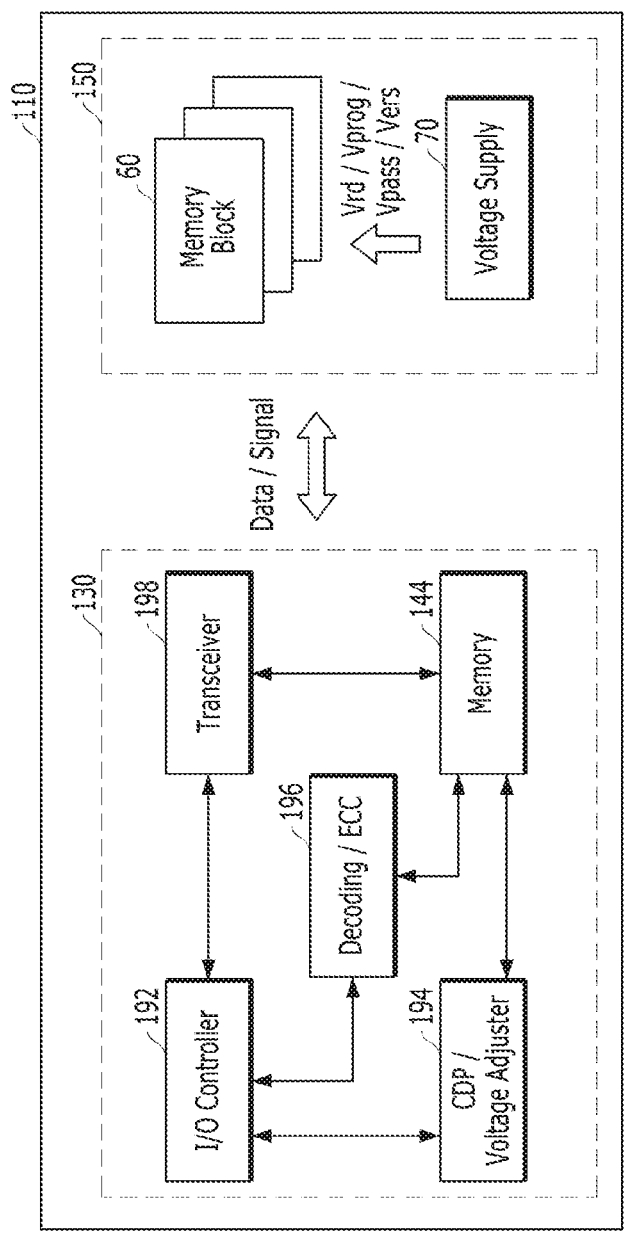
FIG. 1 illustrates a memory system according to an embodiment of the disclosure.

This disclosure includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

DETAILED DESCRIPTION

Various embodiments of the disclosure are described below with reference to the accompanying drawings. Elements and features of the disclosure, however, may be configured or arranged differently to form other embodiments, which may be variations of any of the disclosed embodiments.

In this disclosure, the terms "comprise," "comprising," "include," and "including" are open-ended. As used in the appended claims, these terms specify the presence of the stated elements and do not preclude the presence or addition of one or more other elements. The terms in a claim does not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the unit/circuit/component can be said to be configured to perform the task even when the specified blocks/unit/circuit/component is not currently operational (e.g., is not on). The blocks/units/circuits/components used with the "configured to" language include hardware—for example, circuits, memory storing program instructions executable to implement the operation, etc. Reciting that a block/unit/circuit/component is "configured to" perform one or more tasks is expressly intended not to invoke 35 U.S.C. § 112, sixth paragraph, for that block/unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware.

The term "circuitry" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

An embodiment of the disclosure can provide a data process system and a method for operating the data processing system, which includes components and resources such as a memory system and a host and is capable of dynamically allocating plural data paths used for data communication between the components based on usages of the components and the resources.

An embodiment of this disclosure can provide a method and an apparatus for correcting, curing, or recovering an error when a read operation performed in a memory system fails. In order to correct, cure, or recover the error, the memory system may selectively or adaptively use circuits, algorithms, and programs used to correct, cure, or repair the error based on information available from a non-volatile memory device in the memory system. An error recovery performed based on the information obtained from the non-volatile memory device can avoid unnecessary consumption of resources that occur when the circuits, the algorithms and the programs for correcting and recovering errors are used sequentially or in a prescribed order, so that the memory system can improve efficiency regarding error correction and recovery. Furthermore, the improved efficiency regarding the error correction and recovery in an embodiment of the disclosure can improve performance, operational reliability, or operational stability of the memory system.

In an embodiment, a memory system can include a memory device configured to supply a read voltage into a plurality of non-volatile memory cells and output values obtained from the plurality of non-volatile memory cells; and a controller, coupled to the memory device via at least one channel, configured to adjust a level of the read voltage based on a cell difference probability (CDP) calculated from the values when a read operation to the plurality of non-volatile memory cells fails.

By the way of example but not limitation, the controller can be configured to perform a hard decision decoding to recover data stored in the plurality of non-volatile memory cells when the cell difference probability (CDP) is less than a first reference, and to adjust the level of the read voltage based on the hard decision decoding.

The controller can be configured to perform a soft decision decoding to recover the data stored in the plurality of non-volatile memory cells when the cell difference probability (CDP) is equal to or greater than the first reference.

The controller can be configured, when the cell difference probability (CDP) regarding other values outputted from the memory device after the level of read voltage is adjusted, to perform the soft decision decoding on the other values to recover the data stored in the plurality of non-volatile memory cells.

The controller can be configured to increase or decrease the level of the read voltage by a preset level when a count of unsatisfied check nodes is greater than a second reference.

The controller can be configured, when the count of unsatisfied check nodes is equal to, or less than, the second reference, to either perform a soft decision decoding based on a read voltage having a prescribed level or check a propriety of the first reference.

The cell difference probability (CDP) can indicate whether voltage distribution based on the values before decoding the values falls within a range determined by a preset ratio of the maximum/minimum levels regarding a threshold voltage of each non-volatile memory cell.

The controller can be configured to store a history regarding a scan operation performed after the read voltage is searched, and to compare the cell difference probability (CDP) with a first reference based on the history. The controller can be configured to perform a soft decision decoding on the values when there is no history. The history can exclude a case where the read voltage is adjusted by a read retry operation.

In another embodiment, a method for operating a memory system can include supplying a read voltage to a plurality of non-volatile memory cells to perform a read operation regarding values stored in the plurality of non-volatile memory cells; calculating cell difference probability based on the values read from the plurality of non-volatile memory cells when the read operation is failed; and adjusting the read voltage based on the cell difference probability.

The adjusting the read voltage can include: performing a hard decision decoding to recover data stored in the plurality of non-volatile memory cells when the cell difference probability (CDP) is less than a first reference; and adjusting the level of the read voltage based on the hard decision decoding.

The adjusting the read voltage can further include performing a soft decision decoding to recover the data stored in the plurality of non-volatile memory cells when the cell difference probability (CDP) is equal to, or greater than the first reference.

The adjusting the read voltage can further include performing the soft decision decoding on the other values to recover the data stored in the plurality of non-volatile memory cells, when the other values are outputted from the memory device after the level of read voltage is adjusted.

The adjusting the read voltage can further include performing the soft decision decoding on the other values to recover the data stored in the plurality of non-volatile memory cells, when the cell difference probability (CDP) regarding other values outputted from the memory device after the level of read voltage is adjusted.

The method can further include increasing or decreasing the level of the read voltage by a preset level when a count of unsatisfied check nodes is equal to, or less than, a second reference.

The method can further include, when the count of unsatisfied check nodes is greater than the second reference, either performing a soft decision decoding based on a read voltage having a prescribed level or checking a propriety of the first reference.

The cell difference probability (CDP) can indicate whether voltage distribution based on the values before decoding the values falls within a range determined by a preset ratio of the maximum/minimum levels regarding a threshold voltage of each non-volatile memory cell.

The method can further include storing a history regarding a scan operation performed after the read voltage is searched; and comparing the cell difference probability (CDP) with a first reference based on the history. The method can further include performing a soft decision decoding on the values when there is no history. In the history, a case when the read voltage is adjusted by a read retry operation can be excluded.

Embodiments of the disclosure will now be described with reference to the accompanying drawings, wherein like numbers reference like elements.

FIG. 1 illustrates a memory system according to an embodiment of the disclosure.

Referring to FIG. 1, a memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips.

The memory device 150 may include a plurality of memory blocks 60. The memory block 60 may be understood as a group of non-volatile memory cells in which data is removed together by a single erase operation. Although not illustrated, the memory block 60 may include a page which is a group of non-volatile memory cells that store data together during a single program operation or output data together during a single read operation. For example, one memory block 60 may include a plurality of pages.

Although not shown in FIG. 1, the memory device 150 may include a plurality of memory planes or a plurality of memory dies. According to an embodiment, the memory plane may be considered a logical or a physical partition including at least one memory block 60, a driving circuit capable of controlling an array including a plurality of non-volatile memory cells, and a buffer that can temporarily store data inputted to, or outputted from, non-volatile memory cells.

In addition, according to an embodiment, the memory die may include at least one memory plane. The memory die may be understood as a set of components implemented on a physically distinguishable substrate. Each memory die may be connected to the controller 130 through a data path. Each memory die may include an interface to exchange a piece of data and a signal with the controller 130.

According to an embodiment, the memory device 150 may include at least one memory block 60, at least one memory plane, or at least one memory die. The internal configuration of the memory device 150 shown in FIG. 1 may be different according to performance of the memory system 110. An embodiment of the disclosure is not limited to the internal configuration shown in FIG. 1.

Referring to FIG. 1, the memory device 150 may include a voltage supply circuit 70 capable of supplying at least one voltage into the memory block 60. The voltage supply circuit 70 may supply a read voltage Vrd, a program voltage Vprog, a pass voltage Vpass, or an erase voltage Vers into a non-volatile memory cell included in the memory block 60. For example, during a read operation for reading data stored in the non-volatile memory cell included in the memory block 60, the voltage supply circuit 70 may supply the read voltage Vrd into a selected non-volatile memory cell. During the program operation for storing data in the non-volatile memory cell included in the memory block 60, the voltage supply circuit 70 may supply the program voltage Vprog into a selected non-volatile memory cell. Also, during a read operation or a program operation performed on the selected nonvolatile memory cell, the voltage supply circuit 70 may supply a pass voltage Vpass into a non-selected nonvolatile memory cell. During the erasing operation for erasing data stored in the non-volatile memory cell included in the memory block 60, the voltage supply circuit 70 may supply the erase voltage Vers into the memory block 60.

After programming a piece of data in a non-volatile memory cell included in the memory device 150, the controller 130 may read the piece of data. In the piece of data read by the controller 130, an error (at least 1-bit error) may be occasionally detected when an error correction is not performed. In an initial usage stage of the memory device 150 (e.g., a very slightly worn memory device), it might be hard to find an error in the piece of read data. As the number of write and erase cycles (PIE cycles) increases (e.g., wear of non-volatile memory cells increases), the number of errors may increase. In addition to wear of the memory device 150, an error may occur depending on data retention time which is a period in which the piece of data is safely stored or maintained in the non-volatile memory cells in the memory device 150. Typically, the data retention time may be used as a characteristic parameter for operating the memory device 150. An error may occur, when a piece of data stored in the nonvolatile memory cell could not be distinguished, or clearly recognized, due to a characteristic in which a threshold voltage of the nonvolatile memory cell changes over time.

When the controller 130 performs a read operation, a piece of data stored in a plurality of non-volatile memory cells included in the memory device 150 is transferred to the controller 130. For example, an input/output controller 192 in the controller 130 may perform a read operation. The input/output controller 192 may transmit a read command to the memory device 150 through a transceiver 198. The transceiver 198 may deliver the read command to the memory device 150 and receive a piece of data outputted from the memory device 150. The transceiver 198 may store the piece of data, which is transferred from the memory device 150, in the memory 144.

The input/output controller 192 allows decoding circuitry 196 to check, cure, or correct an error detected in the piece of data stored in the memory 144 in response to the read command. For example, the decoding circuitry 196 may cure or correct an error included in the piece of data stored in the memory 144 through an error correction code (ECC). Although the decoding circuitry 196 has performed an error correction operation using an error correction code (ECC), an error in the piece of data stored in the memory 144 might not be corrected. When the error included in the piece of data corresponding to the read command is not corrected (the piece of data might not be recovered), the input/output controller 192 may determine that the read operation corresponding to the read command may fail.

As described above, an error included in a piece of data outputted from the memory device 150 may be caused by the change of threshold voltage in the non-volatile memory cell. When the read voltage Vrd supplied for reading data stored in a plurality of non-volatile memory cells in the memory device 150 is changed in response to a changed distribution of threshold voltage regarding the plurality of non-volatile memory cells, an error in the piece of data may be reduced or disappeared. When an error included in the piece of data outputted from the memory device 150 in response to a read command is reduced, the decoding circuitry 196 can easily cure or correct an error included in the data.

When the input/output controller 192 determines that the read operation fails, the voltage regulator 194 may calculate a cell difference probability (CDP). Here, the cell difference probability (CDP) may show a threshold voltage distribution regarding a plurality of non-volatile memory cells based on data, which is outputted and transmitted from the plurality of non-volatile memory cells in the memory device 150 before being decoded by the decoding circuitry 196. For example, the cell difference probability (CDP) may indicate a ratio of the number of '1' according to a current bias voltage and the number of '1' according to a bias voltage of optimized boundary. The cell difference probability (CDP) will be described in detail with reference to FIG. 4.

According to an embodiment, in order to calculate the cell difference probability (CDP), the input/output controller 192 may transmit a command to scan data stored in non-volatile memory cells to the memory device 150 through the transceiver 198, in order to supply read voltages Vrd having various levels into the non-volatile memory cells. The memory device 150 can output data corresponding to a threshold voltage distribution of the non-volatile memory cells to the transceiver 198 in response to the scan command. The data received through the transceiver 198 is stored in the memory 144. The voltage regulator 194 can calculate a cell difference probability (CDP) based on the data stored in the memory 144 and adjust, or determine, a level of the read voltage (Vrd) in response to the cell difference probability (CDP). Further, the voltage regulator 194 can select, or determine, an error correction operation which is performed, by the decoding circuitry 196, on the data read corresponding to the command.

According to an embodiment, the controller 130 may calculate a cell difference probability (CDP) based on data obtained through scanning a plurality of non-volatile memory cells in the memory device 150, and select a procedure, or an algorithm, for correcting and restoring an error included in the data outputted corresponding to a read command, based on the cell difference probability (CDP). For example, a direction (e.g., increase or decrease) and a magnitude (e.g., an amount of the change) for adjusting the read voltage Vrd may be estimated or determined based on the cell difference probability CDP. In addition, after performing a hard decision decoding on the data outputted in response to the read command, the controller 130 can check the number of unsatisfied check nodes. For example, in response to the number of unsatisfied check nodes, the controller 130 may perform either a hard decision decoding or a soft decision decoding to correct errors included in the data outputted in response to a read command. Through these processes, the memory system 110 according to an embodiment of the disclosure, when the read operation fails (fail) can provide an improved method and/or an improved apparatus that can correct, cure or repair an error efficiently.

Hereinafter, referring to FIGS. 2 and 3, some operations performed by the memory system 110 are described in detail.

Figure 2:
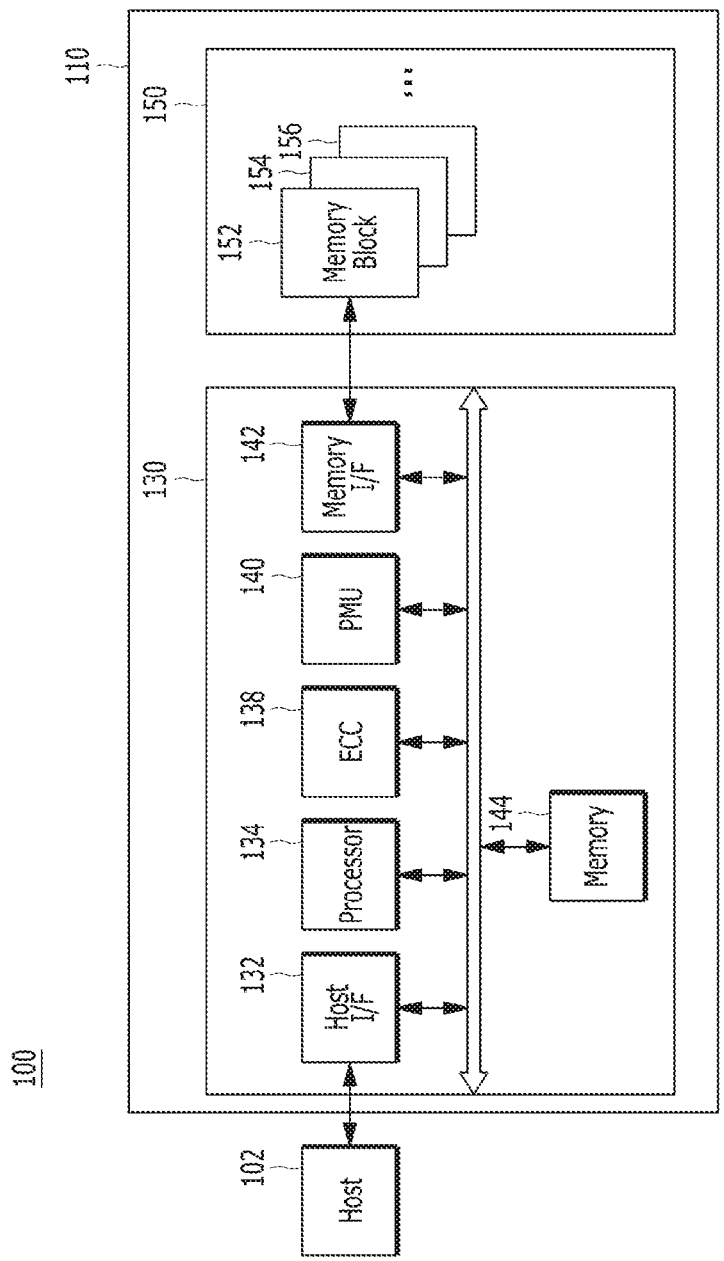
FIG. 2 illustrates a data processing system according to an embodiment of the disclosure.

Referring to FIG. 2, a data processing system 100 in accordance with an embodiment of the disclosure is described. Referring to FIG. 2, the data processing system 100 may include a host 102 engaged or interlocked with a memory system 110.

The host 102 may include, for example, a portable electronic device such as a mobile phone, an MP3 player and a laptop computer, or a non-portable electronic device such as a desktop computer, a game player, a television (TV), a projector and the like.

The host 102 also includes at least one operating system (OS), which can generally manage, and control, functions and operations performed in the host 102. The OS can provide interoperability between the host 102 engaged with the memory system 110 and the user needing and using the memory system 110. The OS may support functions and operations corresponding to a user's requests. By the way of example but not limitation, the OS can be classified into a general operating system and a mobile operating system according to mobility of the host 102. The general operating system may be split into a personal operating system and an enterprise operating system according to system requirements or a user's environment. But the enterprise operating systems can be specialized for securing and supporting high performance computing. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110.

The controller 130 in the memory system 110 may control the memory device 150 in response to a request or a command inputted from the host 102. For example, the controller 130 may perform a read operation to provide a piece of data read from the memory device 150 for the host 102, and perform a write operation (or a program operation) to store a piece of data inputted from the host 102 in the memory device 150. In order to perform data input/output (I/O) operations, the controller 130 may control and manage internal operations for data read, data program, data erase, or the like.

According to an embodiment, the con oiler 130 can include a host interface 132, a processor 134, error correction circuitry 138, a power management unit (PMU) 140, a memory interface 142, and a memory 144. Components included in the controller 130 illustrated in FIG. 2 may vary according to an implementation form, an operation performance, or the like regarding the memory system 110. For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. Components in the controller 130 may be added or omitted based at implementation of the memory system 110.

The host 102 and the memory system 110 may include a controller or an interface for transmitting and receiving a signal, a piece of data, and the like, under a predetermined protocol. For example, the host interface 132 in the memory system 110 may include an apparatus capable of transmitting a signal, a piece of data, and the like to the host 102 or receiving a signal, a piece of data, and the like inputted from the host 102.

The host interface 132 included in the controller 130 may receive a signal, a command (or a request), or a piece of data inputted from the host 102. That is, the host 102 and the memory system 110 may use a predetermined protocol to transmit and receive a piece of data between each other. An example of protocols or interfaces, supported by the host 102 and the memory system 110 for sending and receiving a piece of data, can include Universal Serial Bus (USB), Multi-Media Card (MMC), Parallel Advanced Technology Attachment (PATH), Small Computer System Interface (SCSI), Enhanced Small Disk Interface (ESDI), Integrated Drive Electronics (IDE), Peripheral Component Interconnect Express (PCIE), Serial-attached SCSI (SAS), Serial Advanced Technology Attachment (SATA), Mobile Industry Processor Interface (MIPI), and the like. According to an embodiment, the host interface 132 is a kind of layer for exchanging a piece of data with the host 102 and is implemented with, or driven by, firmware called a host interface layer (HIL).

The Integrated Drive Electronics (IDE) or Advanced Technology Attachment (ATA), used as one of the interfaces for transmitting and receiving a piece of data, can use a cable including 40 wires connected in parallel to support data transmission and reception between the host 102 and the memory system 110. When a plurality of memory systems 110 are connected to a single host 102, the plurality of memory systems 110 may be divided into a master and a slave by using a position or a dip switch to which the plurality of memory systems 110 are connected. The memory system 110 set as the master may be used as the main memory device. The IDE (ATA) has evolved into Fast-ATA, ATAPI, and Enhanced IDE (EIDE).

Serial Advanced Technology Attachment (SATA) is a kind of serial data communication interface that is compatible with various ATA standards of parallel data communication interfaces which is used by Integrated Drive Electronics (IDE) devices. The 40 wires in the IDE interface can be reduced to six wires in the SATA interface. For example, 40 parallel signals for the IDE can be converted into 6 serial signals for the SATA to be transmitted between each other. The SATA has been widely used because of its faster data transmission and reception rate and its less resource consumption in the host 102 used for data transmission and reception. The SATA may support connection with up to 30 external devices to a single transceiver included in the host 102. In addition, the SATA can support hot plugging that allows an external device to be attached or detached from the host 102 even while data communication between the host 102 and another device is being executed. Thus, the memory system 110 can be connected or disconnected as an additional device, like a device supported by a universal serial bus (USB) even when the host 102 is powered on. For example, in the host 102 having an eSATA port, the memory system 110 may be freely detached like an external hard disk.

The Small Computer System Interface (SCSI) is a kind of serial data communication interface used for connection between a computer, a server, and/or another peripheral device. The SCSI can provide a high transmission speed, as compared with other interfaces such as the IDE and the SATA. In the SCSI, the host 102 and at least one peripheral device (e.g., the memory system 110) are connected in series, but data transmission and reception between the host 102 and each peripheral device may be performed through a parallel data communication. In the SCSI, it is easy to connect to, or disconnect from, the host 102 a device such as the memory system 110. The SCSI can support connections of 15 other devices to a single transceiver included in host 102.

The Serial Attached SCSI (SAS) can be understood as a serial data communication version of the SCSI. In the SAS, not only the host 102 and a plurality of peripheral devices are connected in series, but also data transmission and reception between the host 102 and each peripheral device may be performed in a serial data communication scheme. The SAS can support connection between the host 102 and the peripheral device through a serial cable instead of a parallel cable, so as to easily manage equipment using the SAS and enhance or improve operational reliability and communication performance. The SAS may support connections of eight external devices to a single transceiver included in the host 102.

The Non-volatile memory express (NVMe) is a kind of interface based at least on a Peripheral Component Interconnect Express (PCIe) designed to increase performance and design flexibility of the host 102, servers, computing devices, and the like equipped with the non-volatile memory system 110. Here, the PCIe can use a slot or a specific cable for connecting the host 102, such as a computing device, and the memory system 110, such as a peripheral device. For example, the PCIe can use a plurality of pins (for example, 18 pins, 32 pins, 49 pins, 82 pins, etc.) and at least one wire (e.g. x1, x4, x8, x16, etc.), to achieve high speed data communication over several hundred MB per second (e.g. 250 MB/s, 500 MB/s, 984.6250 MB/s, 1969 MB/s, and etc.). According to an embodiment, the PCIe scheme may achieve bandwidths of tens to hundreds of Giga bits per second. A system using the NVMe can make the most of an operation speed of the nonvolatile memory system 110, such as an SSD, which operates at a higher speed than a hard disk.

According to an embodiment, the host 102 and the memory system 110 may be connected through a universal serial bus (USB). The Universal Serial Bus (USB) is a kind of scalable, hot-pluggable plug-and-play serial interface that can provide cost-effective standard connectivity between the host 102 and a peripheral device such as a keyboard, a mouse, a joystick, a printer, a scanner, a storage device, a modem, a video camera, and the like. A plurality of peripheral devices such as the memory system 110 may be coupled to a single transceiver included in the host 102.

Referring to FIG. 2, the error correction circuitry 138 can correct error bits of the data to be processed in (e.g., outputted from) the memory device 150, which may include an error correction code (ECC) encoder and an ECC decoder. Here, the ECC encoder can perform error correction encoding of data to be programmed in the memory device 150 to generate encoded data into which a parity bit is added and store the encoded data in memory device 150. The ECC decoder can detect and correct errors contained in data read from the memory device 150 when the controller 130 reads the data stored in the memory device 150. In other words, after performing error correction decoding on the data read from the memory device 150, the error correction circuitry 138 can determine whether the error correction decoding has succeeded and output an instruction signal (e.g., a correction success signal or a correction fail signal). The error correction circuitry 138 can use the parity bit which is generated during the ECC encoding process, for correcting the error bit of the read data. When the number of the error bits is greater than or equal to a threshold number of correctable error bits, the error correction circuitry 138 might not correct error bits but instead may output an error correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The error correction circuitry 138 may include all circuits, modules, systems, and/or devices for performing the error correction operation based on at least one of the above described codes.

For example, the ECC decoder may perform a hard decision decoding or a soft decision decoding to data transmitted from the memory device 150. Here, the hard decision decoding can be understood as one of two methods broadly classified for error correction. The hard decision decoding may include an operation of correcting an error by reading digital data of '0' or '1' from a non-volatile memory cell in the memory device 150. Because the hard decision decoding handles a binary logic signal, a design or a configuration of circuit or algorithm may be simple and a processing speed may be faster than the soft decision decoding.

Meanwhile, the soft decision decoding, which is distinguished from the hard decision decoding, may quantize a threshold voltage of a nonvolatile memory cell in the memory device 150 by two or more quantized values (e.g., multiple bit data, approximate values, an analog value, and the like) to correct an error based on the two or more quantized values. The controller 130 can receive two or more alphabets or quantized values from a plurality of non-volatile memory cells in the memory device 150, and then perform a decoding based on information generated by characterizing the quantized values as a combination of information such as conditional probability or likelihood.

According to an embodiment, the ECC decoder may use low-density parity-check and generator matrix (LDPC-GM) code among methods designed for the soft decision decoding. Here, the low-density parity-check (LDPC) code uses an algorithm that can read values of data from the memory device 150 in several bits according to reliability, not simply data of 1 or 0 like the hard decision decoding, and iteratively repeats it through a message exchange to improve reliability of the values, and then the values are finally determined as data of 1 or 0. For example, a decoding algorithm using LDPC codes can be understood as a probabilistic decoding. The hard decision decoding in which a value outputted from a non-volatile memory cell is coded as 0 or 1. Compared to the hard decision decoding, the soft decision decoding can determine the value stored in the non-volatile memory cell based on the stochastic information. Regarding bit-flipping which may considered an error that can occur in the memory device 150, the soft decision decoding may provide improved probability of correcting an error and recovering data, as well as provide a reliability and stability of corrected data. The LDPC-GM code may have a scheme in which internal LDGM codes can be concatenated in series with high-speed LDPC codes.

According to an embodiment, the ECC decoder may use a low-density parity-check conventional convolutional codes (LDPC-CCs) code among methods designed for the soft decision decoding. Herein, the LDPC-CCs code may have a scheme using a linear time encoding and a pipeline decoding based on a variable block length and a shift register.

According to an embodiment, the ECC decoder may use a Log Likelihood Ratio Turbo Code (LLR-TC) among methods designed for the soft decision decoding. Herein, the Log Likelihood Ratio (LLR) may be calculated as a non-linear function for a distance between a sampled value and an ideal value. In addition, Turbo Code (TC) may include a simple code (for example, a Hamming code) in two or three dimensions, and repeat decoding in a row direction and a column direction to improve reliability of values.

The power management unit (PMU) 140 may control electrical power provided in the controller 130. The PMU 140 may monitor the electrical power supplied to the memory system 110 (e.g., a voltage supplied to the controller 130) and provide the electrical power to components included in the controller 130. The PMU 140 can not only detect power-on or power-off, but also generate a trigger signal to enable the memory system 110 to back up a current state urgently when the electrical power supplied to the memory system 110 is unstable. According to an embodiment, the PMU 140 may include a device or a component capable of accumulating electrical power that may be used in an emergency.

The memory interface 142 may serve as an interface for handling commands and data transferred between the controller 130 and the memory device 150, to allow the controller 130 to control the memory device 150 in response to a command or a request inputted from the host 102. The memory interface 142 may generate a control signal for the memory device 150 and may process data inputted to, or outputted from, the memory device 150 under the control of the processor 134 in a case when the memory device 150 is a flash memory. For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) as a component for exchanging data with the memory device 150.

According to an embodiment, the memory interface 142 may support an open NAND flash interface (ONFi), a toggle mode or the like for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), and a toggle double data rate (DDR).

The memory 144 may be a sort of working memory in the memory system 110 or the controller 130, while storing temporary or transactional data occurred or delivered for operations in the memory system 110 and the controller 130. For example, the memory 144 may temporarily store a piece of read data outputted from the memory device 150 in response to a request from the host 102, before the piece of read data is outputted to the host 102. In addition, the controller 130 may temporarily store a piece of write data inputted from the host 102 in the memory 144, before programming the piece of write data in the memory device 150. When the controller 130 controls operations such as data read, data write, data program, data erase or etc. of the memory device 150, a piece of data transmitted or generated between the controller 130 and the memory device 150 of the memory system 110 may be stored in the memory 144. In addition to the piece of read data or write data, the memory 144 may store information (e.g., map data, read requests, program requests, etc.) necessary for performing operations for inputting or outputting a piece of data between the host 102 and the memory device 150. According to an embodiment, the memory 144 may include a command queue, a program memory, a data memory, a write buffer/cache, a read buffer/cache, a data buffer/cache, a map buffer/cache, and the like.

In an embodiment, the memory 144 may be implemented with a volatile memory. For example, the memory 144 may be implemented with a static random access memory (SRAM), a dynamic random access memory (DRAM), or both. Although FIG. 2 illustrates, for example, the memory 144 disposed within the controller 130, the embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150, in response to a write request or a read request entered from the host 102. According to an embodiment, the processor 134 may execute firmware to control the program operation or the read operation in the memory system 110. Herein, the firmware may be referred to as a flash translation layer (FTL). An example of the FTL is later described in detail, referring to FIG. 3. According to an embodiment, the processor 134 may be implemented with a microprocessor or a central processing unit (CPU).

According to an embodiment, the memory system 110 may be implemented with at least one multi-core processor. The multi-core processor is a kind of circuit or chip in which two or more cores, which are considered distinct processing regions, are integrated. For example, when a plurality of cores in the multi-core processor drive or execute a plurality of flash translation layers (FTLs) independently, data input/output speed (or performance) of the memory system 110 may be improved. According to an embodiment, the data input/output (I/O) operations in the memory system 110 may be independently performed through different cores in the multi-core processor.

The processor 134 in the controller 130 may perform an operation corresponding to a request or a command inputted from the host 102. Further, the memory system 110 may be independent of a command or a request inputted from an external device such as the host 102. Typically, an operation performed by the controller 130 in response to the request or the command inputted from the host 102 may be considered a foreground operation, while an operation performed by the controller 130 independently (e.g., regardless the request or the command inputted from the host 102) may be considered a background operation. The controller 130 can perform the foreground or background operation for read, write or program, erase and the like regarding a piece of data in the memory device 150. In addition, a parameter set operation corresponding to a set parameter command or a set feature command inputted as a set command transmitted from the host 102 may be considered a foreground operation. Meanwhile, as a background operation without a command transmitted from the host 102, the controller 130 can perform garbage collection (GC), wear leveling (WL), bad block management for identifying and processing bad blocks, or the like may be performed, in relation to a plurality of memory blocks 152, 154, 156 included in the memory device 150.

According an embodiment, substantially similar operations may be performed as both the foreground operation and the background operation. For example, if the memory system 110 performs garbage collection in response to a request or a command inputted from the host 102 (e.g., Manual GC), garbage collection can be considered a foreground operation. However, when the memory system 110 performs garbage collection independently of the host 102 (e.g., Auto GC), garbage collection can be considered a background operation.

When the memory device 150 includes a plurality of dies (or a plurality of chips) including non-volatile memory cells, the controller 130 may be configured to perform a parallel processing regarding plural requests or commands inputted from the host 102 in to improve performance of the memory system 110. For example, the transmitted requests or commands may be divided and processed simultaneously into a plurality of dies or a plurality of chips in the memory device 150. The memory interface 142 in the controller 130 may be connected to a plurality of dies or chips in the memory device 150 through at least one channel and at least one way. When the controller 130 distributes and stores pieces of data in the plurality of dies through each channel or each way in response to requests or a commands associated with a plurality of pages including nonvolatile memory cells, plural operations corresponding to the requests or the commands can be performed simultaneously or in parallel. Such a processing method or scheme can be considered as an interleaving method. Because data input/output speed of the memory system 110 operating with the interleaving method may be faster than that without the interleaving method, data I/O performance of the memory system 110 can be improved.

By the way of example but not limitation, the controller 130 can recognize statuses regarding a plurality of channels (or ways) associated with a plurality of memory dies included in the memory device 150. The controller 130 may determine the status of each channel or each way as one of a busy status, a ready status, an active status, an idle status, a normal status, and/or an abnormal status. The controller's determination of which channel or way an instruction (and/or a data) is delivered through can be associated with a physical block address, e.g., which die(s) the instruction (and/or the data) is delivered into. The controller 130 can refer to descriptors delivered from the memory device 150. The descriptors can include a block or page of parameters that describe something about the memory device 150, which is data with a predetermined format or structure. For instance, the descriptors may include device descriptors, configuration descriptors, unit descriptors, and the like. The controller 130 can refer to, or use, the descriptors to determine which channel(s) or way(s) an instruction or a data is exchanged via.

Referring to FIG. 2, the memory device 150 in the memory system 110 may include the plurality of memory blocks 152, 154, 156. Each of the plurality of memory blocks 152, 154, 156 includes a plurality of nonvolatile memory cells. According to an embodiment, the memory block 152, 154, 156 can be a group of nonvolatile memory cells erased together. The memory block 152, 154, 156 may include a plurality of pages which is a group of nonvolatile memory cells read or programmed together. Although not shown in FIG. 2, each memory block 152, 154, 156 may have a three-dimensional stack structure for a high integration. Further, the memory device 150 may include a plurality of dies, each die including a plurality of planes, each plane including the plurality of memory blocks 152, 154, 156. Configuration of the memory device 150 can be different for performance of the memory system 110.

In the memory device 150 shown in FIG. 2, the plurality of memory blocks 152, 154, 156 are included. The plurality of memory blocks 152, 154, 156 can be any of different types of memory blocks such as a single-level cell (SLC) memory block, a multi-level cell (MLC) Cell) memory block, or the like, according to the number of bits that can be stored or represented in one memory cell. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have larger storage capacity for the same space compared to the SLC memory block. The MLC memory block can be highly integrated in a view of storage capacity. In an embodiment, the memory device 150 may be implemented with MLC memory blocks such as a double level cell (DLC) memory block, a triple-level cell (TLC) memory block, a quadruple-level cell (QLC) memory block and a combination thereof. The double-level cell (DLC) memory block may include a plurality of pages implemented by memory cells, each capable of storing 2-bit data. The triple-level cell (TLC) memory block can include a plurality of pages implemented by memory cells, each capable of storing 3-bit data. The quadruple-level cell (QLC) memory block can include a plurality of pages implemented by memory cells, each capable of storing 4-bit data. In another embodiment, the memory device 150 can be implemented with a block including a plurality of pages implemented by memory cells, each capable of storing five or more bits of data.

According to an embodiment, the controller 130 may use a multi-level cell (MLC) memory block included in the memory system 150 as an SLC memory block that stores one-bit data in one memory cell. A data input/output speed of the multi-level cell (MLC) memory block can be slower than that of the SLC memory block, That is, when the MLC memory block is used as the SLC memory block, a margin for a read or program operation can be reduced. The controller 130 can utilize a faster data input/output speed of the multi-level cell (MLC) memory block when using the multi-level cell (MLC) memory block as the SLC memory block. For example, the controller 130 can use the MLC memory block as a buffer to temporarily store a piece of data, because the buffer may require a high data input/output speed for improving performance of the memory system 110.

Further, according to an embodiment, the controller 130 may program pieces of data in a multi-level cell (MLC) a plurality of times without performing an erase operation on a specific MLC memory block included in the memory system 150. In general, nonvolatile memory cells have a feature that does not support data overwrite. However, the controller 130 may use a feature in which a multi-level cell (MLC) may store multi-bit data, in order to program plural pieces of 1-bit data in the MLC a plurality of times. For MLC overwrite operation, the controller 130 may store the number of program times as separate operation information when a piece of 1-bit data is programmed in a nonvolatile memory cell. According to an embodiment, an operation for uniformly levelling threshold voltages of nonvolatile memory cells can be carried out before another piece of data is overwritten in the same nonvolatile memory cells.

In an embodiment of the disclosure, the memory device 150 is embodied as a nonvolatile memory such as a flash memory, for example, as a NAND flash memory, a NOR flash memory, and the like. Alternatively, the memory device 150 may be implemented by at least one of a phase change random access memory (PCRAM), a ferroelectrics random access memory (FRAM), a spin injection magnetic memory (STT-RAM), and a spin transfer torque magnetic random access memory (STT-MRAM), or the like.

Figure 3:
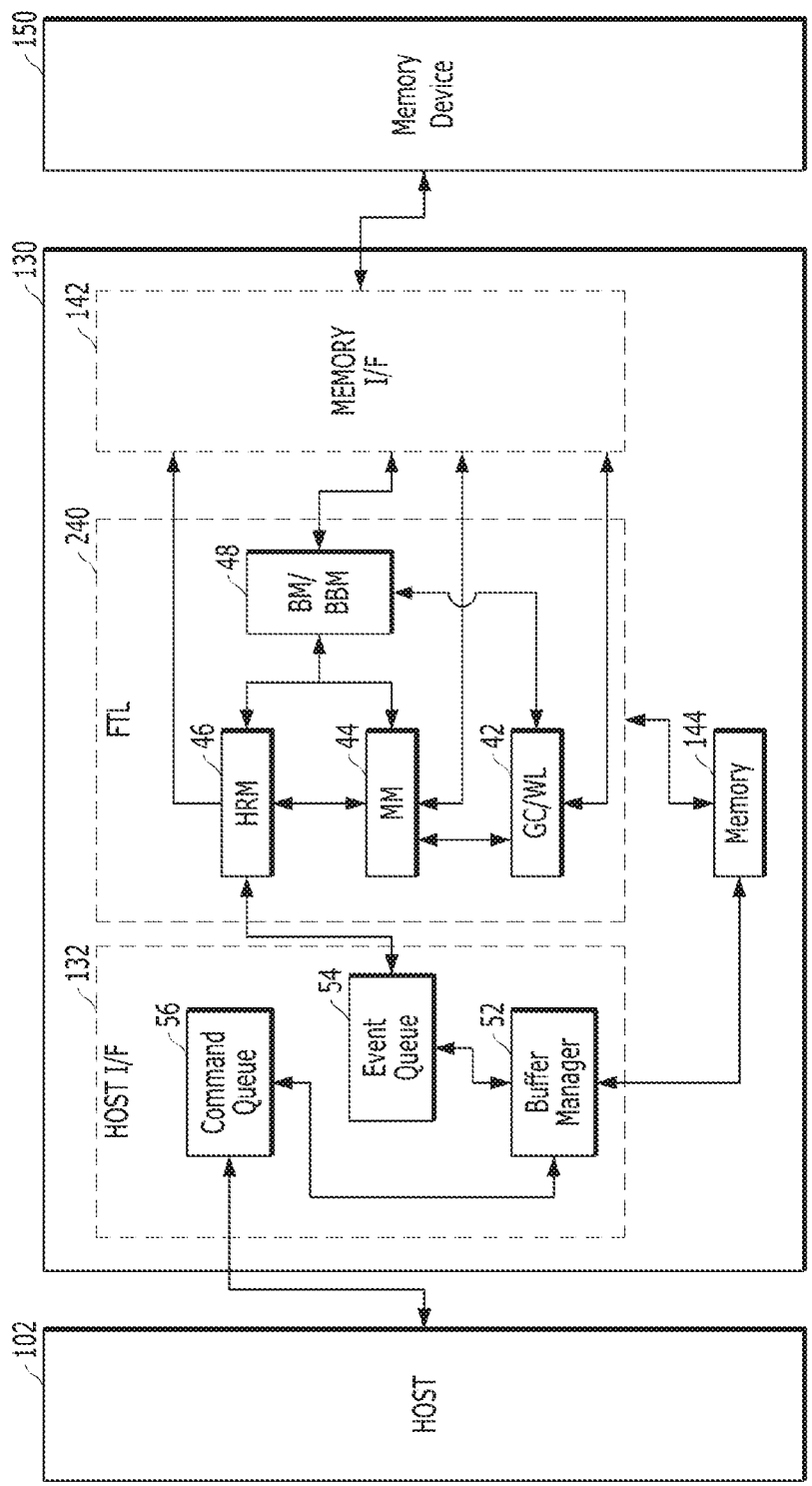
FIG. 3 illustrates a memory system according to an embodiment of the disclosure.

Referring to FIG. 3, a controller 130 in a memory system in accordance with another embodiment of the disclosure is described. The controller 130 cooperates with the host 102 and the memory device 150. As illustrated, the controller 130 includes a host interface 132, a flash translation layer (FTL) 240, as well as the host interface 132, the memory interface 142, and the memory 144 previously identified in connection with FIG. 2.

Although not shown in FIG. 3, in accordance with an embodiment, the ECC unit 138 illustrated in FIG. 2 may be included in the flash translation layer (FTL) 240. In another embodiment, the ECC unit 138 may be implemented as a separate module, a circuit, firmware, or the like, which is included in, or associated with, the controller 130.

The host interface 132 is for handling commands, data, and the like transmitted from the host 102. By way of example but not limitation, the host interface 132 may include a command queue 56, a buffer manager 52, and an event queue 54. The command queue 56 may sequentially store commands, data, and the like received from the host 102 and output them to the buffer manager 52 in an order in which they are stored. The buffer manager 52 may classify, manage, or adjust the commands, the data, and the like, which are received from the command queue 56. The event queue 54 may sequentially transmit events for processing the commands, the data, and the like received from the buffer manager 52.

A plurality of commands or data of the same characteristic, e.g., read or write commands, may be transmitted from the host 102, or commands and data of different characteristics may be transmitted to the memory system 110 after being mixed or jumbled by the host 102. For example, a plurality of commands for reading data (read commands) may be delivered, or commands for reading data (read command) and programming/writing data (write command) may be alternately transmitted to the memory system 110. The host interface 132 may store commands, data, and the like, which are transmitted from the host 102, to the command queue 56 sequentially. Thereafter, the host interface 132 may estimate or predict what kind of internal operation the controller 130 will perform according to the characteristics of commands, data, and the like, which have been entered from the host 102. The host interface 132 can determine a processing order and a priority of commands, data and the like, based at least on their characteristics. According to characteristics of commands, data, and the like transmitted from the host 102, the buffer manager 52 in the host interface 132 is configured to determine whether the buffer manager should store commands, data, and the like in the memory 144, or whether the buffer manager should deliver the commands, the data, and the like into the flash translation layer (FTL) 240. The event queue 54 receives events, entered from the buffer manager 52, which are to be internally executed and processed by the memory system 110 or the controller 130 in response to the commands, the data, and the like transmitted from the host 102, so as to deliver the events into the flash translation layer (FTL) 240 in the order received.

In accordance with an embodiment, the flash translation layer (FTL) 240 illustrate in FIG. 3 may work as a multi-thread scheme to perform the data input/output (I/O) operations. A multi-thread FTL may be implemented through a multi-core processor using multi-thread included in the controller 130.

In accordance with an embodiment, the flash translation layer (FTL) 240 can include a host request manager (HRM) 46, a map manager (MM) 44, a state manager 42, and a block manager 48. The host request manager (FIRM) 46 can manage the events entered from the event queue 54. The map manager (MM) 44 can handle or control a map data. The state manager 42 can perform garbage collection (GC) or wear leveling (WL). The block manager 48 can execute commands or instructions onto a block in the memory device 150.

By way of example but not limitation the host request manager (HRM) 46 can use the map manager (MM) 44 and the block manager 48 to handle or process requests according to the read and program commands, and events which are delivered from the host interface 132. The host request manager (HRM) 46 can send an inquiry request to the map data manager (MM) 44, to determine a physical address corresponding to the logical address which is entered with the events. The host request manager (HRM) 46 can send a read request with the physical address to the memory interface 142, to process the read request (handle the events). On the other hand, the host request manager (HRM) 46 can send a program request (write request) to the block manager 48, to program data to a specific empty page (no data) in the memory device 150, and then, can transmit a map update request corresponding to the program request to the map manager (MM) 44, to update an item relevant to the programmed data in information of mapping the logical-physical addresses to each other.

Here, the block manager 48 can convert a program request delivered from the host request manager (HRM) 46, the map data manager (MM) 44, and/or the state manager 42 into a flash program request used for the memory device 150, to manage flash blocks in the memory device 150. In order to maximize or enhance program or write performance of the memory system 110 (see FIG. 2), the block manager 48 may collect program requests and send flash program requests for multiple-plane and one-shot program operations to the memory interface 142. In an embodiment, the block manager 48 sends several flash program requests to the memory interface 142 to enhance or maximize parallel processing of the multi-channel and multi-directional flash controller.

On the other hand, the block manager 48 can be configured to manage blocks in the memory device 150 according to the number of valid pages, select and erase blocks having no valid pages when a free block is needed, and select a block including the least number of valid pages when it is determined that garbage collection is necessary. The state manager 42 can perform garbage collection to move the valid data to an empty block and erase the blocks containing the moved valid data so that the block manager 48 may have enough free blocks (empty blocks with no data). If the block manager 48 provides information regarding a block to be erased to the state manager 42, the state manager 42 could check all flash pages of the block to be erased to determine whether each page is valid. For example, to determine validity of each page, the state manager 42 can identify a logical address recorded in an out-of-band (OOB) area of each page. To determine whether each page is valid, the state manager 42 can compare the physical address of the page with the physical address mapped to the logical address obtained from the inquiry request. The state manager 42 sends a program request to the block manager 48 for each valid page. A mapping table can be updated through the update of the map manager 44 when the program operation is complete.

The map manager 44 can manage a logical-physical mapping table. The map manager 44 can process requests such as queries, updates, and the like, which are generated by the host request manager (HRM) 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request can be sent to the block manager 48 so that a clean cache block is made and the dirty map table may be stored in the memory device 150.

On the other hand, when garbage collection is performed, the state manager 42 copies valid page(s) into a free block, and the host request manager (HRM) 46 can program the latest version of the data for the same logical address of the page and currently issue an update request. When the status manager 42 requests the map update in a state in which copying of valid page(s) is not completed normally, the map manager 44 might not perform the mapping table update. It is because the map request is issued with old physical information if the status manger 42 requests a map update and a valid page copy is completed later. The map manager 44 may perform a map update operation to ensure accuracy only if the latest map table still points to the old physical address.

Figure 4:
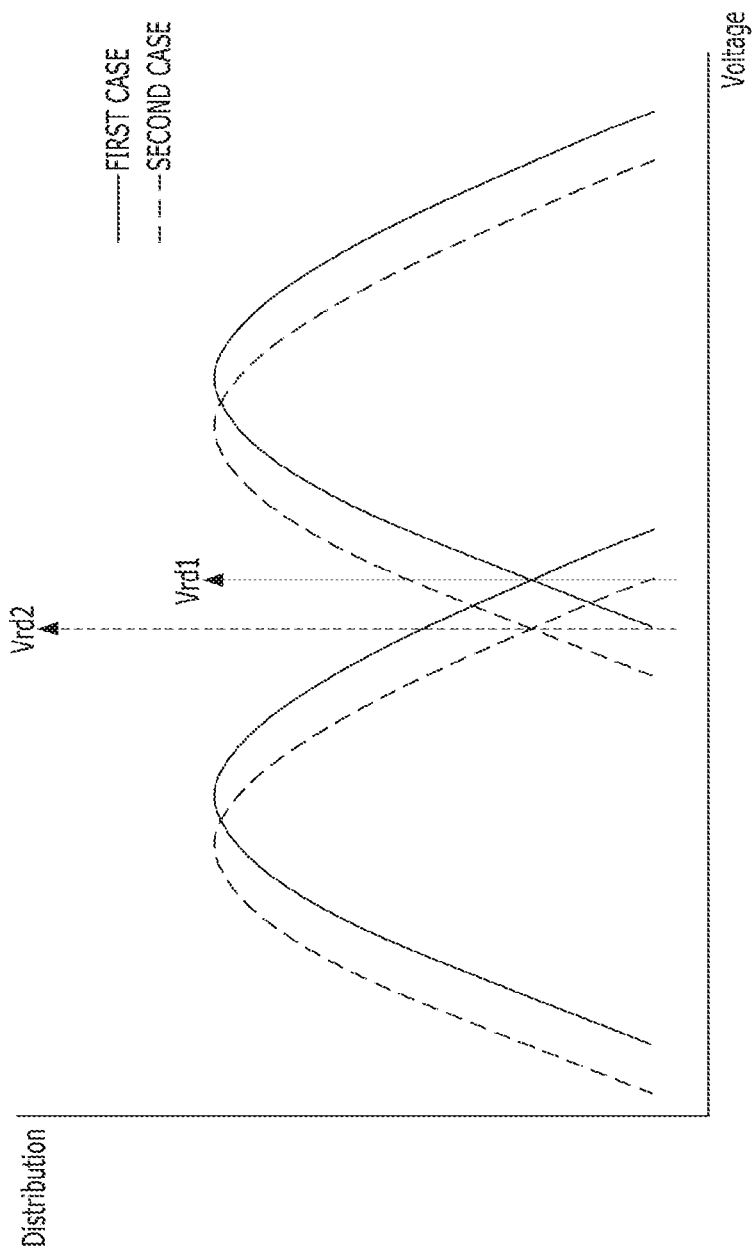
FIG. 4 illustrates distributions regarding a read voltage supplied to non-volatile memory cells.

FIG. 4 illustrates distributions regarding a read voltage supplied to non-volatile memory cells.

Referring to FIG. 4, a threshold voltage of a non-volatile memory cell in the memory device 150 (see FIGS. 1 to 3) may change over time. In a first case, threshold voltages of the nonvolatile memory cells each storing one of two different data (e.g., '0' and '1') at the first time point may be distributed like two parabolas. For example, it is assumed that, in the first case, there are one thousand non-volatile memory cells each storing data of '0' and one thousand non-volatile memory cells each storing data of '1' in the memory device 150. The threshold voltages of the non-volatile memory cells storing the data of '0' may be distributed as a left parabola shown in FIG. 4, and the threshold voltages of the non-volatile memory cells storing data of '1' may be distributed as a right parabola shown in FIG. 4. In the first case, the most effective read voltage Vrd1 used to clearly recognize the data of '0' and '1' may be determined by the controller 130 (refer to FIGS. 1 to 3), which has a voltage level corresponding to a position where the left parabola and the right parabola intersect.

Time passes, so threshold voltage distribution of the non-volatile memory cells may change from the first case to a second case. For example, the threshold voltages of the non-volatile memory cells in the first case may move toward a natural state or a balanced state. In the second case, the threshold voltage distribution may change to a left side (a direction in which the potential decreases) as shown in FIG. 4. When the threshold voltage distribution of the non-volatile memory cells changes, the most effective read voltage for identifying data of '0' and '1' would be changed from a level of the read voltage (Vrd1) in the first case to another level of the read voltage (Vrd2) at the second case.

As illustrated in FIG. 4, if the controller 130 can check or recognize how much level of threshold voltages is changed when time passes, e.g., a difference between the threshold voltage distributions of the non-volatile memory cells between the first case and the second case, the most effective read voltage may be determined more easily or accurately than a conventional way that the most effective read voltage is determined based on a regular change (increase or decrease) between a minimum level and a maximum level. Through this process, the likelihood of the controller 130 failing to read data stored in the memory device 150 may be lowered, and the operational stability of the memory system 110 (see FIGS. 1 to 3) may be improved.

Figure 5:
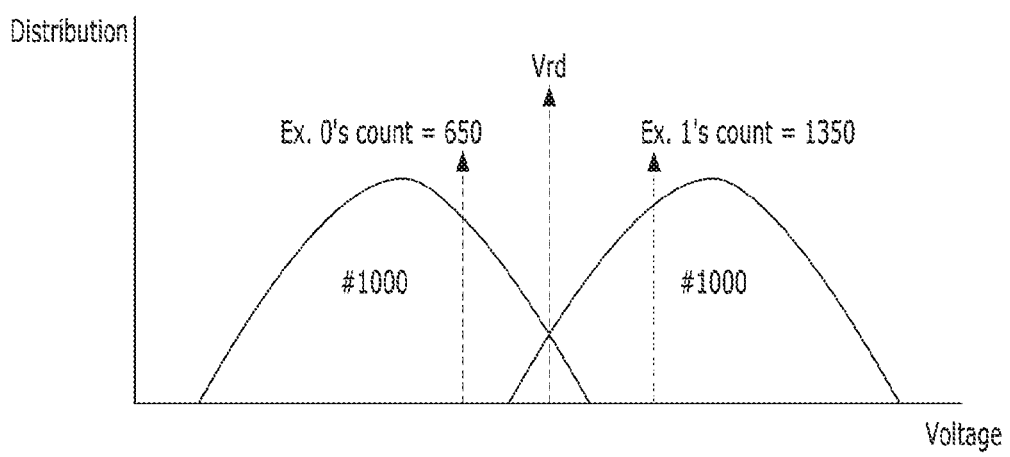
FIG. 5 illustrates a cell difference probability (CDP) of non-volatile memory cells.

FIG. 5 illustrates a cell difference probability (CDP) of non-volatile memory cells.

Referring to FIG. 5, the controller 130 (see FIGS. 1 to 3) can perform a cell distribution scan (CDS) operation on at least some region in the memory device 150 (see FIGS. 1 to 3). The memory device 150 may store data by increasing randomness of data to improve a lifespan and a reliability of the non-volatile memory cells. For example, the memory interface 142 (see FIGS. 1 to 3) or the randomizer included in the memory device 150 may generate randomized values corresponding to actual data associated with a specific address. The randomized values may be stored in non-volatile memory cells in the memory device 150. Through the randomizer, the numbers of specific values or data (e.g., data of '0' and '1') stored in non-volatile memory cells connected to a single word line WL may be the same (substantially identical with each other). Based on the randomized values stored in the non-volatile memory cells, not the actual data, it is possible to estimate a distribution regarding the threshold voltages of the non-volatile memory cells in the memory device 150.

Based on a result of the cell distribution scan (CDS) operation, the controller 130 may determine the cell difference probability (CDP) to infer a threshold voltage of the non-volatile memory cell in the memory device 150. For example, it is assumed that there are 1000 nonvolatile memory cells (#cells each PV) storing data of '0' and '1' in the memory device 150. The most effective read voltage Vrd used for identifying the data of '0' and '1' may have a voltage level corresponding to a position where the left parabola and the right parabola intersect.

According to an embodiment, the cell difference probability (CDP) may be calculated by the following equation. The cell difference probability (CDP) may be determined based on: the number of memory cells (Ones) turned on during the cell distribution scan (CDS) operation, the number of memory cells included in each parabola (#cells each PV) in the ideal threshold voltage distribution, and the predicted ratio (Ri) of threshold voltage distributions.

$$CDP = \frac{|Ones - (\text{\# cells each } PV \times R_i)|}{\text{\# cells each } PV}$$

For example, it is assumed that the controller 130 may expect 1000 of data of '1' (Ones) when supplying the most effective read voltage (Vrd) into the 2000 non-volatile memory cells. Herein, the most effective read voltage (Vrd) may be considered a read voltage currently used for recognizing two adjacent data (data of "0" and "1," or data of "01" and "10"). The predicted ratio Ri is 1. When a read voltage having a greater level (e.g., by 0.05V) than the most effective read voltage (Vrd) is supplied into 2000 non-volatile memory cells, the number of data of '1' ('Ones,' the number of memory cells turned on by the read voltage) is 1350. Because it is recognized that the number of data of is 1350 rather than 1000, the cell difference probability (CDP) may be about 35% when converted into a percentage (%). In addition, when providing another read voltage having a lower level (e.g., by the same level of 0.05V) than the most effective read voltage (Vrd), the number of data of '0' (Ones) may be 650. The cell difference probability (CDP) may be about 35%, as the number of data 'Ones' is recognized as 650 rather than 1000.

As illustrated in FIG. 5, after changing (i.e., increasing and decreasing) the most effective read voltage (Vrd) by the same level to determine read voltages, the cell difference probability (CDP) regarding each of data of '0' and '1' may be estimated. When the two cell difference probabilities (CDPs) are the same, it might not be necessary to adjust the most effective read voltage (Vrd).

On the other hand, when supplying the read voltages changed by the same amount from the most effective read voltage (Vrd) into the non-volatile memory cells in order to estimate the cell difference probabilities (CDPs) regarding the data of '0' and '1', the controller 130 may obtain two different cell difference probabilities (CDPs). The controller 130 may determine that it is necessary to change a level of the most effective read voltage (Vrd). Although not shown, when a first cell difference probability (CDP) regarding data of '0' is greater than a second cell difference probability (CDP) regarding data of it might be necessary that the most effective read voltage (Vrd) be changed in a direction, i.e., toward a read voltage that was used for estimating the second cell difference probability (CDP) regarding the data of '1.' On the other hand, when the second cell difference probability (CDP) regarding the data of '1' is greater than the first cell difference probability (CDP) regarding the data of '0', it might be necessary that the most effective read voltage (Vrd) be changed in another direction, i.e., toward a read voltage that was used for estimating the first cell difference probability (CDP) regarding the data of '0.'

Over time, it can be assumed that the threshold voltage distribution including a left parabola regarding 1000 non-volatile memory cells storing data of '0' in the memory device 150 and a right parabola regarding 1000 other non-volatile memory cells storing data of '1' has changed. If read voltages having larger and smaller levels than a most effective read voltage Vrd are supplied, it is possible to estimate two cell difference probabilities (CDPs) regarding the number of data of '1' and the number of data of '0'. The difference between the two cell difference probabilities (CDPs) may indicate which direction the most effective read voltage Vrd needs to be changed, i.e., increasing or decreasing the most effective read voltage Vrd to more clearly recognize data stored in the non-volatile memory cells.

According to an embodiment, when the controller 130 stores a previous cell difference probability (CDP), the controller 130 can calculate a single cell difference probability (CDP) rather than two cell difference probabilities (CDPs) regarding the number of data of '1' and the number of data of '0.' When the controller 130 tracks cell difference probability (CDP) regarding either the number of data of '1' or the number of data of '0,' the controller 130 can recognize in which direction the most effective read voltage Vrd needs to be changed based on a tracked cell difference probability (CDP).

On the other hand, in the threshold voltage distribution including a left parabola regarding the 1000 nonvolatile memory cells storing the data of '0' and a right parabola regarding the 1000 nonvolatile memory cells storing the data of '1,' a cell difference probability (CDP) regarding the data of '0' or '1' might not be 0%. For example, even when the threshold voltage distribution regarding the non-volatile memory cells has not substantially shifted or changed, the cell difference probability (CDP) based on the current read voltage might not be 0%. That is, when the cell difference probability (CDP) is lower than a preset criterion (e.g., 1% to 5%), it might not be necessary to change the most effective read voltage Vrd currently used.

Herein, the preset criterion may vary depending on characteristics of the non-volatile memory cells included in the memory device 150. The characteristics of the non-volatile memory cells may be determined during manufacturing. Further, the characteristics of the non-volatile memory cells may be changed through operations of programming, reading and erasing data in the nonvolatile memory cells. For example, the characteristics of the non-volatile memory cells may vary based on wear or a lifespan thereof. According to an embodiment, the controller 130 may monitor or track characteristics of the nonvolatile memory cells included in the memory device 150 to determine the preset criterion relevant to the cell difference probability (CDP).

According to an embodiment, an operation for calculating the cell difference probability (CDP) may include plural scan operations using a plurality of read voltages, i.e., a plurality of read voltages having different levels which are greater or less (e.g., ±0.01V, ±0.03V, ±0.05V) than the most effective read voltage (Vrd). The plural scan operations using the plurality of read voltages may be performed multiple times. When the scan operations are performed multiple times, it is possible to more clearly determine a direction (increase or decrease) and a magnitude (level, amount) which are applicable to change the most effective read voltage (Vrd) based on the cell difference probability (CDP).

Figure 6:
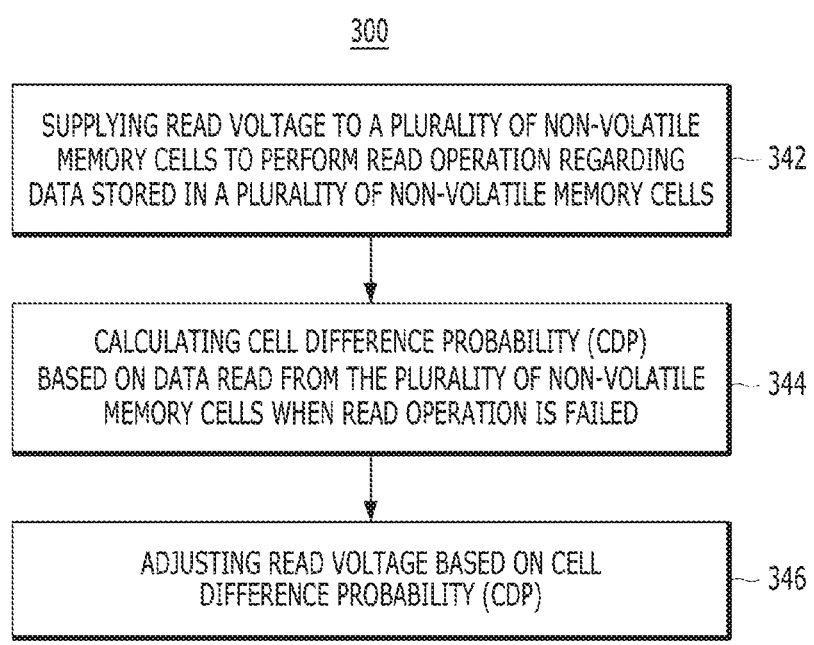
FIG. 6 illustrates a method for operating a memory system according to an embodiment of the disclosure.

FIG. 6 illustrates a method for operating a memory system according to an embodiment of the disclosure. An internal configuration of the memory system illustrated in FIG. 6 may be understood with reference to FIGS. 1 to 3.

Referring to FIG. 6, a method for operating a memory system 300 may include supplying a read voltage to a plurality of nonvolatile memory cells to perform a read operation (step 342). When a read command or a read request is inputted from an external device (e.g., the host 102 shown in FIGS. 1 and 2), the controller 130 may perform a read operation based on a logical address inputted along with the read command or the read request. The controller 130 may search for a physical address corresponding to the logical address in map data (or meta data), e.g., perform address translation, and read data stored in non-volatile memory cells corresponding to the physical address in the memory device 150. According to an embodiment, when the logical address and the physical address are both transmitted from the external device to the memory system 110, the controller 130 may omit an operation for the address translation.

When the read operation succeeds after the controller 130 performs the read operation (342), the memory system 110 may output data requested by the external device. Herein, the success of the read operation may include a case in which data transmitted from the memory device 150 to the controller 130 is error-free or correctable even if an error is included in the data. For example, through the decoding circuitry 196 illustrated in FIG. 1 or the error correction circuitry 138 illustrated in FIG. 2, it is possible to check whether the error is included in the data transmitted from the memory device 150 and to correct or cure the error, if the error is included in the data, based on a preset algorithm or a circuit.

When the read operation fails after the controller 130 performs the read operation (342), the memory system 110 might not output data requested by the external device. The method for operating the memory system 300 may include calculating the cell difference probability (CDP) based on values outputted from the plurality of non-volatile memory cells when the read operation fails (step 344). Also, the method for operating the memory system 300 may include adjusting the read voltage based on the cell difference probability (346).

When the read operation fails, there are various reasons or causes in the memory system 110. For example, when a defect occurs in the non-volatile memory cells in which data is stored, the corresponding data might not be read or outputted. Referring to FIGS. 4 and 5, when threshold voltages of the non-volatile memory cells are changed, stored data may be recognized incorrectly when the read voltage is supplied. In this case, when the read voltage supplied into the non-volatile memory cells is adjusted, data stored in the non-volatile memory cells can be read more correctly and clearly.

When the threshold voltages of the non-volatile memory cells are changed, data of '0' and '1' (or "01" and "10" in MLC) are reversed (recognized incorrectly) in response to the read voltage, so that an error occurs in data transferred from the non-volatile memory cells of the memory device 150 to the controller 130. Even if there is an error in which '0' and '1' are reversed in a part of the data, a read operation is considered to be successful if the error is cured or corrected through the decoding circuitry 196 illustrated in FIG. 1 or the error correction circuitry 138 illustrated in FIG. 2. However, if there are many errors (error bits) in which data of '0' and '1' are reversed in the data, the number of error bits may be beyond a limit for curing or correcting the errors through the decoding circuitry 196 illustrated in FIG. 1 or the error correction circuitry 138 illustrated in FIG. 2. In this case, the read voltage may be adjusted and supplied into the non-volatile memory cells in the memory device 150. When the number of errors (reversed data of '0' and '1') in the data transferred from the non-volatile memory cells of the memory device 150 to the controller 130 is reduced due to the adjusted read voltage, the errors may be cured or corrected through the decoding circuitry 196 illustrated in FIG. 1 or the error correction circuitry 138 illustrated in FIG. 2.

In order to change or adjust a level of the read voltage, the controller 130 may randomly increase or decrease the read voltage. However, in this case, overheads are easily generated in an operation for the controller 130 to change or adjust the level of the read voltage. However, referring to FIG. 5, the controller 130 according to an embodiment of the disclosure may estimate a direction and/or a magnitude of adjustment regarding how a level of the read voltage is to be changed or adjusted based on the cell difference probability (CDP). Through the cell difference probability (CDP), the memory system 110 can reduce overheads in the process of changing or adjusting the most effective read voltage (Vrd).

The memory system 110 according to an embodiment of the disclosure might not only change or adjust a level of the read voltage but also reduce a time required to cure or correct an error detected in data outputted from non-volatile memory cells of the memory device 150. Data input/output performance of the memory system 110 can be improved. Hereinafter, a method for operating the memory system 110 will be described in more detail with reference to FIGS. 7 to 10.

Figure 7:
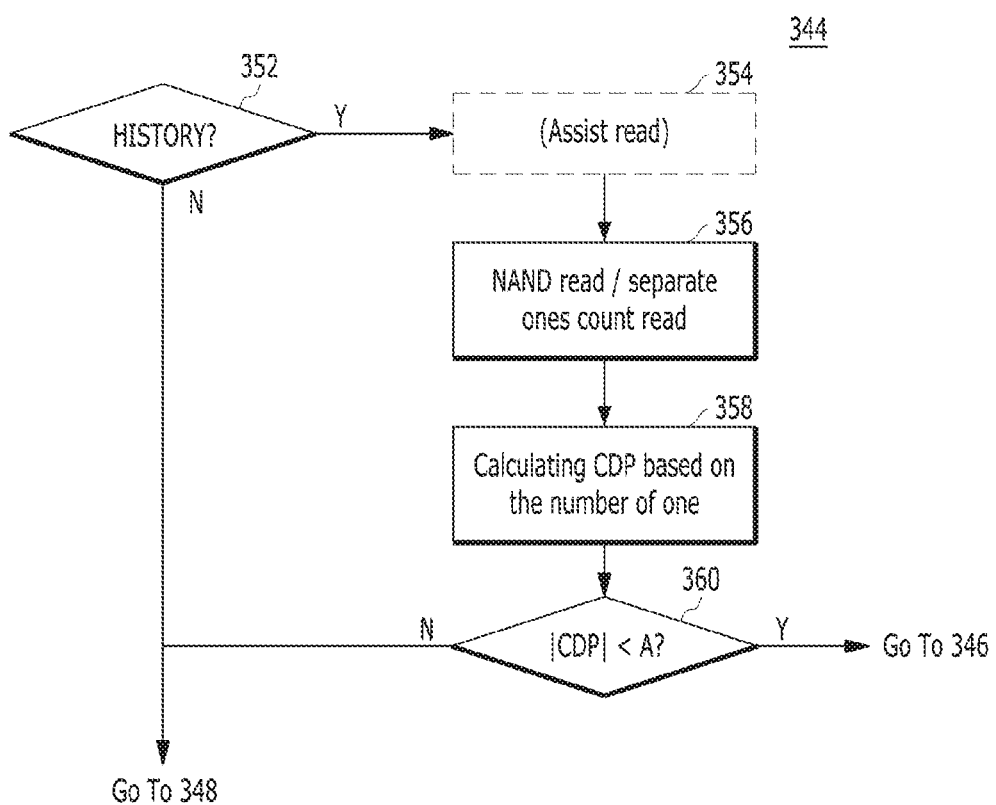
FIG. 7 illustrates a method for operating a memory system based on the CDP.

FIG. 7 illustrates a method for operating a memory system based on the cell difference probability (CDP). According to an embodiment, a method for operating the memory system based on the cell difference probability (CDP), illustrated in FIG. 7, may be included in the step (344) for calculating the cell difference probability (CDP) based on values outputted from a plurality of non-volatile memory cells when a read operation fails in the method for operating the memory system 300, which is illustrated in FIG. 6.

Referring to FIG. 7, the method for operating the memory system based on the cell difference probability (CDP) may include checking a history (step 352). When the memory system 110 determines that an error is included in data corresponding to a read operation, the memory system 110 may correct or cure the error in various ways to recover the data. Herein, when the history includes all cases in which the error included in the data is corrected or recovered, the amount of information which the controller 130 should check, monitor, and track may be too large. In addition, the information regarding error correction or data recovery might not be used later in a process for curing or correcting an error to recover the data. Therefore, according to an embodiment of the disclosure, the history managed by the controller 130 may include information regarding an error correction and recovery operation performed through an operation for searching, adjusting, or changing the most effective read voltage (Vrd) based on the cell difference probability (CDP). However, the history might exclude an error correction and recovery operation through an algorithm, or a code, used in a read retry operation performed by the controller 130. It is because the read retry operation may be performed regularly based on a prescribed order or a prescribed algorithm/code, not dynamically performed based on the cell difference probability (CDP). For example, information regarding a case when an error is corrected, or data is recovered, by an error correction operation regularly performed through the decoding circuitry 196 illustrated in FIG. 1 or the error correction circuitry 138 illustrated in FIG. 2 might not be included in the history.

After the read operation fails, the controller 130 may check the history (the step 352). When there is no history (N in the step 352), the controller 130 might not calculate the cell difference probability (CDP) (Go To 348). The controller 130 may perform an operation for correcting an error included in data through the decoding circuitry 196 illustrated in FIG. 1 or the error correction circuitry 138 illustrated in FIG. 2 without calculating the cell difference probability (CDP). The operation for correcting the error included in the data without calculating the cell difference probability (CDP) will be described later with reference to FIG. 9.

When the history exists (Y in the step 352), the controller 130 may calculate the cell difference probability (CDP). According to an embodiment, in order to calculate the cell difference probability (CDP), the controller 130 may perform an additional read operation for scanning or reading threshold voltages regarding a plurality of non-volatile memory cells of the memory device 150 to obtain values (e.g., analogue-like values) corresponding to multiple bits (step 354). However, for example, an additional read operation to check the distribution regarding threshold voltages of the plurality of non-volatile memory cells, when included in the SLC block, of the memory device 150 might not be necessary. That is, the threshold voltages of the non-volatile memory cells in the SLC block can be classified through a single reference. However, in order to determine the cell difference probability (CDP) for specific multi-bit data based on the distribution regarding threshold voltages of a plurality of non-volatile memory cells included in the MLC block of the memory device 150, additional read operations using different read voltage levels (e.g., Assist Read) may be required. In the case of the MLC block, because the threshold voltages of the non-volatile memory cells can be classified through a plurality of criteria, an additional read operation may be performed according to how many bits of data each non-volatile memory cell stores.

The controller 130 may distinguish data of '0' and/or lll from each other based on the distribution regarding the threshold voltages of the plurality of non-volatile memory cells in the SLC block of the memory device 150 (step 356). Thereafter, the controller 130 may calculate the cell difference probability (CDP) based on the number of values corresponding to the data of '0' and/or '1' (the step 358). Thereafter, the calculated cell difference probability (CDP) may be compared with a first reference A (step 360).

When the cell difference probability (CDP) is less than the first reference A (Y in the step 360), the controller 130 may determine that it is necessary to change or adjust a level of the read voltage. In this case, an operation for correcting an error included in the data may be performed through the decoding circuitry 196 illustrated in FIG. 1 or the error correction circuitry 138 illustrated in FIG. 2, which is included in the controller 130 (Go To the step 346). When the cell difference probability (CDP) is less than the first reference A, it can be determined that the distribution regarding threshold voltages of the plurality of non-volatile memory cells (see FIGS. 4 and 5) is not widely spread. Referring to FIGS. 4 to 5, when the distribution regarding threshold voltages corresponding to specific data is narrow (when the width (i.e., a voltage range) of a Gaussian distribution (i.e., parabolas) is narrow), it may be easy to reduce errors in data stored in the plurality of non-volatile memory cells through a minute change regarding a level of the read voltage.

On the other hand, when the cell difference probability (CDP) is equal to, or larger than, the first reference A (N in the step 360), the controller 130 may determine that there is no need to change or adjust a level of the read voltage. The cell difference probability (CDP) can be an absolute value obtained by the above-described equation. In this case, the controller 130 may perform an operation for changing or adjusting a level of the read voltage (Go To the step 348). When the cell difference probability (CDP) is equal to or greater than the first reference (A), it may be determined that the distribution regarding threshold voltages of the plurality of non-volatile memory cells (refer to FIGS. 4 and 5) is widely spread. Referring to FIGS. 4 to 5, when the distribution of threshold voltages corresponding to specific data is widely spread (when the width (i.e., a voltage range) of a Gaussian distribution (i.e., parabolas) is wide), the plurality of non-volatile memory cells may include widely-changed threshold voltages. Through an operation for minutely adjusting or changing a level of the read voltage, a lot of errors in the data stored in the non-volatile memory cells might be not reduced. In this case, when the ECC decoder included in the controller 130 performs more calculations or operations by increasing a level/degree of soft decision decoding rather than minutely changing or adjusting a level of the read voltage, to increase a possibility of correcting errors and recovering data.

As described above, the method for operating the memory system using the cell difference probability (CDP) illustrated in FIG. 7 may be performed by the controller 130 illustrated in FIGS. 1 to 3. According to an embodiment, a procedure of calculating the cell difference probability (CDP) illustrated in FIG. 7 or comparing the cell difference probability (CDP) with the first reference A may be performed through the voltage regulator 194 illustrated in FIG. 1.

Figure 8:
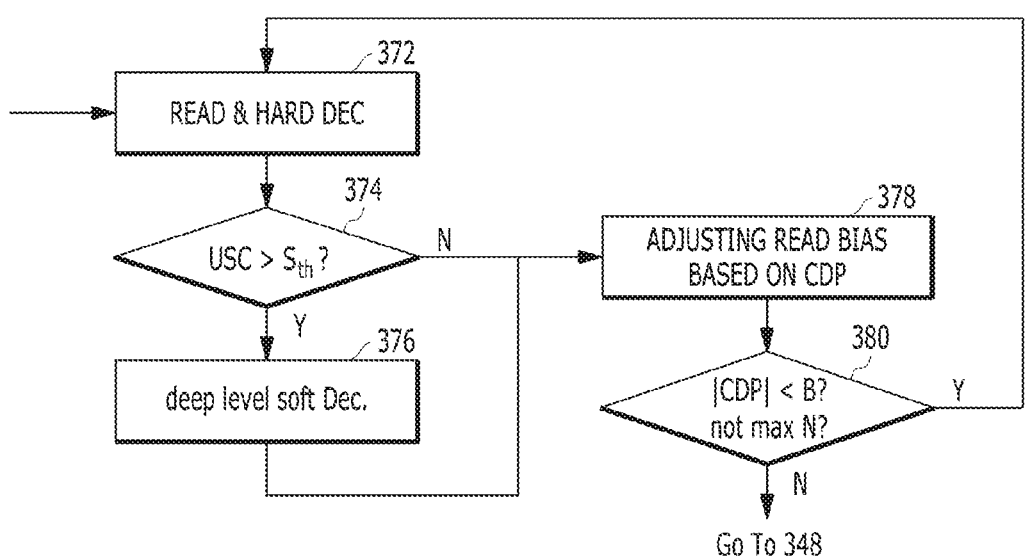
FIG. 8 illustrates a first example of a method for operating a memory system to adjust a read voltage.

FIG. 8 illustrates a first example of a method for operating a memory system to adjust a read voltage.

Referring to FIG. 8, the method for operating the memory system to adjust a level of the read voltage (step 346) may be performed, when the controller 130 determines that it is necessary to change or adjust the level of the read voltage (Y in the step 360 shown in FIG. 7).

The controller 130 may read data from a specific area of the memory device 150 and perform a hard decision decoding to the data (step 372). Although not shown, when the error in the data is corrected by the hard decision decoding (the step 372), the error correction and recovery operation may be terminated. That is, after the error has been cured or corrected, the operation method for adjusting a level of the read voltage may no longer need to be performed.

As a result of performing the hard decision decoding to the data (the step 372), if the error in the data is not corrected, the memory system can check whether there are more unsatisfied check (USC) nodes than a preset number of times (Sth) (step 374). Herein, the unsatisfied check node (USC node) may indicate a node that does not satisfy a test expression according to a predetermined algorithm in a process for determining whether the read operation fails. Referring to FIG. 7, the memory system has been recognized that the distribution regarding the threshold voltages of non-volatile memory cells corresponding to a specific data is narrow (i.e., a case when the cell difference probability (CDP) is less than the first reference A), but the unsatisfied check node (USC) is larger than the preset number of times (Sth). In this case, the memory system can determine that there are a lot of the non-volatile memory cells belonging to a range where two parabolas in the distribution (e.g., threshold voltages corresponding to two adjacent data) overlaps with each other (see FIGS. 4 and 5). The range (i.e., an overlapped region of two threshold voltages in the distribution) can be recognized as a range determined based on an absolute ratio (e.g., ±1%, ±5%, or ±10%, etc.) from the most effective read voltage (Vrd) which is used for identifying two adjacent data (data of "0" and "1", or data of "01" and "10") in the distribution regarding threshold voltages of the non-volatile memory cells.

When the unsatisfied check (USC) node is greater than the preset number of times (Sth) (Y in the step 374), the controller 130 can perform a deep-level (e.g., high-level) soft decision decoding (step 376). Herein, the deep-level (high-level) soft decision decoding may refer to the soft decision decoding having a predetermined level that the ECC decoder included in the controller 130 can perform. The level of the soft decision decoding may correspond to the number of read voltages (e.g., the number of different biases/levels of the read voltage) used for scanning or collecting values or data for the soft decision decoding. For example, a two-level soft decision decoding can use a single bias (a single level of the read voltage), and a four-level soft decision decoding can use two biases (two levels of the read voltage).

According to an embodiment, if the ECC decoder can perform an up to 10-level (ten-level) soft decision decoding, the up to 10-level soft decision decoding is likely to correct the maximum level error (e.g., the maximum error bits) to recover data. However, it is assumed that, when the ECC decoder performs a 6-level or 8-level soft-decision decoding, the ECC decoder could correct an error not at the maximum level but close to the maximum level (e.g., about 70 to 90% of the maximum level), for recovering the data. In consideration of computational efficiency (resource efficiency), the controller 130 may perform the 6-level or 8-level soft decision decoding as the deep-level soft decision decoding. At this time, a level of the read voltage used by the controller 130 is within a certain range (e.g., ±1%, ±5% or ±10%, etc.) from the most effective read voltage (Vrd) which is used for identifying two adjacent data (data of "0" and "1," or data of "01" and "10") in the distribution regarding threshold voltages of the non-volatile memory cells. When the error in the data is recovered through performing the deep-level (high-level) soft decision decoding, the operation for data correction and recovery may be terminated. However, when the error in the data has been not corrected and the data has been not recovered by the deep-level (high-level) soft decision decoding, the controller 130 may determine that it is necessary to adjust and change a level of the read voltage.

In addition, when the unsatisfied check (USC) node is not more than the preset number of times Sth (N in the step 374), a level of the read voltage can be adjusted based on the cell difference probability (CDP) (step 378). In this case, the controller 130 may determine that the number of non-volatile memory cells each having a threshold voltage belonging to a range where adjacent threshold voltages in the distribution cross (see FIGS. 4 and 5) is not large. Therefore, the controller 130 can correct an error in the data more quickly by collecting data after changing or adjusting a level of the read voltage rather than performing a soft decision decoding (the step 376) using a plurality of read voltages each having slightly different levels. As described with reference to FIG. 5, based on the cell difference probability (CDP), the controller 130 may determine how a level of the read voltage is changed or adjusted (i.e., increased or decreased). According to an embodiment, the controller 130 may determine how much the level of the read voltage is changed or adjusted based on the cell difference probability (CDP).

After changing and adjusting the level of the read voltage (the step 378), the controller 130 may calculate the cell difference probability (CDP) again and compare the cell difference probability (CDP) with a second reference B (the step 380). When the error rate (CDP) is less than the second reference B (Y in the step 380), data stored in the non-volatile memory cells of the memory device 150 may be read, and a hard decision decoding may be performed (step 372). However, when the cell difference probability (CDP) is equal to, or greater than, the second reference B (N in the step 380), an operation for correcting an error to recover data may be performed by the decoding circuitry 196 illustrated in FIG. 1 or the error correction circuitry 138 illustrated in FIG. 2, which is included in the controller 130 (Go To the step 348). Herein, the second reference B may be less than the first reference A illustrated in FIG. 7. For example, the second reference B may be set to be less than the first reference A by a preset ratio through a procedure for testing an operation to correct an error to recover data outputted from the memory device 150. In addition, according to an embodiment, the second reference B can be differently or dynamically determined based on characteristics or operational state (e.g., wear) of the non-volatile memory cells in the memory device 150 (e.g., distribution or a range regarding a specific data), the number of changes or adjustments for the read voltage, ECC decoder performance in the controller 130, and the like.

On the other hand, after changing and adjusting a level of the read voltage (the step 378), the controller 130 can check how many times the level of the read voltage is changed and adjusted. The controller 130 can check whether the number of changes or adjustments exceeds the maximum value (max N) (the step 380). When the number of changes or adjustments regarding a level of the read voltage have not exceeded the maximum value (max N) (Y in the step 380), data stored in the non-volatile memory cells of the memory device 150 is read and then the hard decision decoding is performed to the data (the step 372). However, when the number of changes or adjustments regarding the level of the read voltage exceeds the maximum value (max N) (N in the step 380), the data stored in the non-volatile memory cells of the memory device 150 may be corrected or recovered by the decoding circuitry 196 illustrated in FIG. 1 or the error correction circuitry 138 illustrated in FIG. 2, which is included in the controller 130 (Go To the step 348). According to an embodiment, the maximum value (max N) may be set based on the characteristics or operational state (e.g., wear) of the non-volatile memory cells in the memory device 150 (e.g., distribution or a range regarding a specific data) or the amounts (magnitude) of changes or adjustments for the read voltage.

Figure 9:
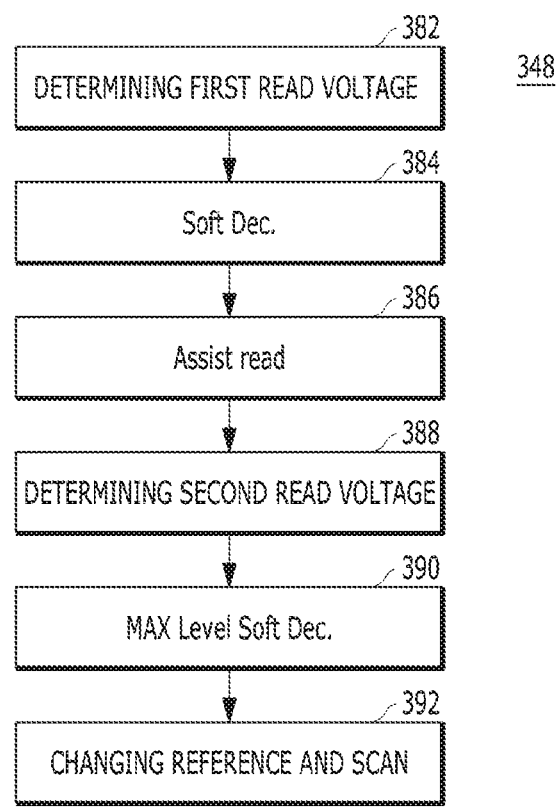
FIG. 9 illustrates a method for operating a memory system to recover an error.

FIG. 9 illustrates a method for operating a memory system to recover an error. According to an embodiment, referring to FIG. 7, when it is determined that it is more efficient to correct and repair an error through a soft decision decoding after collecting threshold voltage distributions of non-volatile memory cells through various algorithms rather than changing a level of the read voltage, the method for operating the memory system to recover the error (the step 348) illustrated in FIG. 9 may be provided.

Referring to FIG. 9, the method for operating the memory system to correct errors (the step 348) may include a process of curing or correcting errors included in data by sequentially applying a plurality of algorithms or a plurality of error correction codes. The plurality of algorithms or the plurality of error correction codes illustrated in FIG. 9 are shown as an example. The plurality of algorithms or the plurality of error correction codes may be changed in response to an operation performance of the memory system 110.

The method for operating the memory system to correct an error and recover data (the step 348) may include searching for a first read voltage supplied into a plurality of non-volatile memory cells (step 382) and performing a soft decision decoding based on the first read voltage (step 384). Here, a process for searching the first read voltage may use one of various algorithms. For example, the step 382 of searching for the first read voltage may perform a Gaussian Modeling (GM) operation to estimate an average threshold voltage of selected one among distributions regarding threshold voltages of non-volatile memory cells. The Gaussian Modeling (GM) operation can be performed by the controller 130 which supplies reference voltages into the non-volatile memory cells to read data from the non-volatile memory cells, calculates the number of non-volatile memory cells having a threshold voltage belonging to threshold voltage intervals determined by the reference voltages, and calculating average threshold voltages of selected threshold voltage distributions, which are estimated based on the number of non-volatile memory cells, by using a Gaussian distribution function. For example, based on the average threshold voltages of the selected threshold voltage distributions, the controller 130 can determine the first read voltage suitable for distinguishing the selected threshold voltage distributions from each other.

According to an embodiment, a Poisson distribution function, a Binomial Distribution function, a Hypergeometric Distribution function, a Gamma Distribution function, or a Geometric Distribution function may be applicable to search for the first read voltage, instead of the Gaussian Distribution function.

Based on data/values collected through the first read voltages (e.g., a first threshold voltage collection), the controller 130 may perform a soft decision decoding (the step 384). Although not shown, when an error included in data is corrected and the data is recovered through the soft decision decoding performed based on information collected through the first threshold voltage collection process, the operation for correcting the error and recovering the data may be terminated.

When the error is not corrected and the data is not recovered through the soft decision decoding performed based on the information collected through the first threshold voltage collection, the controller 130 can perform an additional read operation (step 386). Herein, the additional read operation (step 386) can be performed to collect necessary information which may be used for following processes to search for a second read voltage (step 388) and change a reference (e.g., a table) and scan the non-volatile memory cells (step 392). However, according to an embodiment, when an algorithm used in the step 388 of searching for the second read voltage does not require additional data, the information collected through the additional read operation (step 386) may be used in the step 392 for reference change and scan.

Thereafter, the controller 130 may perform the step 388 of searching for the second read voltage regarding the plurality of non-volatile memory cells. Herein, the steps 382, 388 of searching for the first read voltage and the second read voltage may be individually performed through a different algorithm. For example, as an example of the first read voltage search method, the Gaussian modeling (GM) operation may be efficient in finding a first read voltage in a rough range based on a distribution regarding threshold voltages of the plurality of non-volatile memory cells. However, in the Gaussian modeling (GM) operation, when the threshold voltages of the plurality of non-volatile memory cells is widely spread (e.g., parabolas in the distribution become wide), it may be difficult to clearly recognize or specify the distribution of the threshold voltages. Further, the first read voltage may be insufficient to recognize or specify the distribution of the threshold voltages that have been wide. For example, in order to collect a clear distribution in each section or a specific section based on the distribution regarding the threshold voltages of the non-volatile memory cells found through the step 382 of searching for the first read voltage, a current-controlled scheme (CCS) can be applicable to the step 388 of searching for the second read voltage. For example, in order to clearly recognize the distribution regarding the threshold voltages of the non-volatile memory cells, a current path including the nonvolatile memory cells may be supplied with plural currents having different levels. Through this process, it is possible to search for the second read voltage that is more precisely adjusted than the first read voltage. According to an embodiment, a voltage-controlled scheme (VCS) may be applicable to the step 388 of retrieving the second read voltage.

Based on the information collected through the step 388 of searching for the second read voltage, the controller 130 may perform the soft decision decoding (step 390). According to an embodiment, in the step 390 of performing the soft decision decoding, the controller 130 may perform the maximum level soft decision decoding which the ECC decoder can perform. Although not illustrated, when an error included in data is corrected and the data is recovered through the maximum level soft decision decoding performed based on the information collected through the step 388 of searching for the second threshold voltage, the operation for correcting the error and recovering the data may be terminated.

When the error included in the data is not corrected through the step 390 of performing the soft decision decoding, the method for operating the memory system to recover the error 348 may include performing a table change to scan threshold voltages of non-volatile memory cells to determine distribution of the threshold voltages and decode the threshold voltages based on the determined distribution (the step 392). Herein, the table may include a criterion showing that the read voltages between each parabola in the distribution are determined. For example, levels of the read voltages may have an equal/regular difference or a prescribed interval in a threshold voltage distribution regarding a non-volatile memory cell which can store several bits of data. For example, when the read voltages are equally spaced, which are determined through the step 382 of searching for the first read voltage and the step 388 of searching for the second read voltage, an error between specific parabolas of the distribution may still not be cured or corrected. In this case, the controller 130 can attempt to change the table to determine a level of the read voltage between the specific parabolas of the distribution that have not been clearly recognized. For example, the controller 130 might not change a level of the read voltage used to recognize threshold voltages corresponding to two adjacent data of '11' and '10,' but may selectively change a level of the read voltage used to recognize threshold voltages corresponding to two other adjacent data of '01' and '11' among the 2-bit data. Accordingly, levels of the read voltages in the distribution may be selectively adjusted. Through this procedure, levels of the read voltage between each parabola in the threshold voltage distribution may be determined to have a random difference/interval rather than the regular difference or the prescribed interval.

When an error included in the data is corrected through the decoding performed by the controller 130 based on the information collected through the table change, the procedure for correcting the error and recovering the data may be finished. On the other hand, if the error contained in the data cannot be recovered through decoding performed based on the information through the table change, the controller 130 may determine that the error contained in the data may be uncorrectable.

Figure 10:
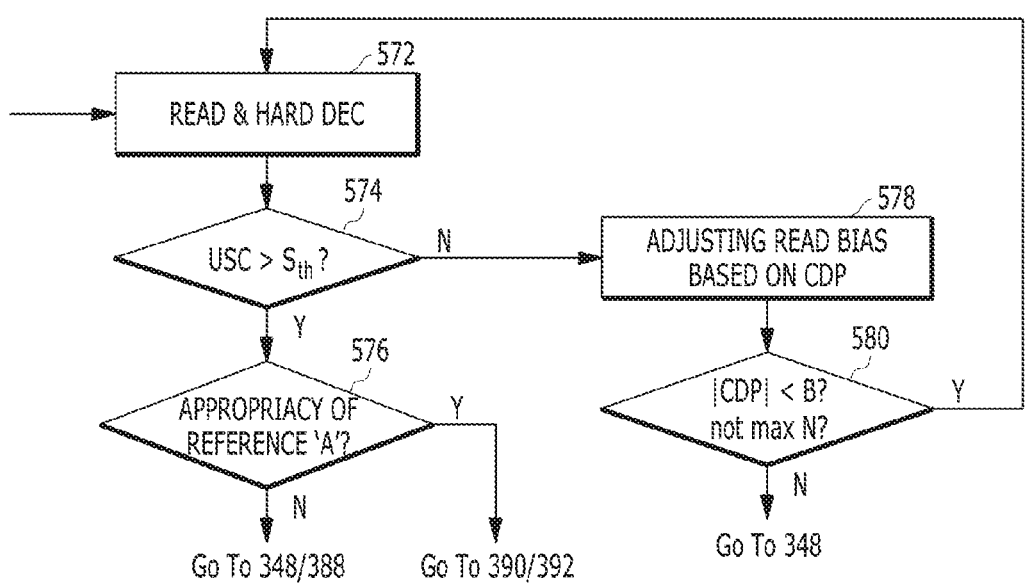
FIG. 10 illustrates a second example of a method for operating a memory system to adjust a read voltage.

FIG. 10 illustrates a second example of a method for operating a memory system to adjust a read voltage. Specifically, the method for operating the memory system for adjusting a level of the read voltage (step 546) illustrated in FIG. 10 may be provided as another embodiment of the method for operating the memory system to adjust a level of the read voltage (step 346) illustrated in FIG. 8.

Referring to FIG. 10, an operation method 546 of a memory system for adjusting a read voltage can include reading data of a specific region in the memory device 150 and performing a hard decision decoding to the data (step 572). When an error of the data is not corrected after performing the hard decision decoding (the step 572), the controller 130 can compare the number of unsatisfied check (USC) nodes with a preset number of times (Sth) (step 574). In addition, when the unsatisfied check (USC) node is not more than the preset number of times (Sth) (N in the step 574), the controller 130 can use the cell difference probability (CDP) to adjust a level of the read voltage (i.e., read bias) (step 578).

As described above, when the width of parabola in the threshold voltage distribution regarding the non-volatile memory cells (see FIGS. 4 and 5) is widened or the parabola of the threshold voltage distribution regarding the non-volatile memory cells is entirely shifted (e.g., a level of the threshold voltage rises/falls), the cell difference probability (CDP) may increase. In addition, the unsatisfied check (USC) node may increase as the number of error bits increases. If the cell difference probability (CDP) is less than the first reference A (V in the step 360 of FIG. 7) and the unsatisfied check (USC) node is less than the preset number of times (Sth) (N in the step 574 of FIG. 10), the controller 130 can determine that it is effective to adjust a level of the read voltage for reducing errors in the data outputted from the non-volatile memory cells.

In the operation method 546 of the memory system for adjusting a level of the read voltage, after changing and adjusting the read voltage (step 578), the controller 130 may calculate the cell difference probability (CDP) again and compare the cell difference probability (CDP) with the second reference B (step 580). When the cell difference probability (CDP) is less than the second reference B (Y in the step 580), data stored in the nonvolatile memory cells of the memory device 150 may be read and the hard decision decoding may be performed to the data (step 572). However, when the cell difference probability (CDP) is equal to, or greater than, the second reference B (N in the step 380), an operation for correcting an error to recover data may be performed by the decoding circuitry 196 illustrated in FIG. 1 or the error correction circuitry 138 illustrated in FIG. 2, which is included in the controller 130 (Go To the step 348).

Further, after changing and adjusting a level of the read voltage (the step 578), the controller 130 can check how many times the level of the read voltage is changed and adjusted. The controller 130 can check whether the number of changes or adjustments exceeds the maximum value (max N) (the step 580). When the number of changes or adjustments regarding a level of the read voltage have not exceeded the maximum value (max N) (Y in the step 580), data stored in the non-volatile memory cells of the memory device 150 is read and then the hard decision decoding is performed to the data (the step 572). However, when the number of changes or adjustments regarding the level of the read voltage exceeds the maximum value (max N) (N in the step 580), the data stored in the non-volatile memory cells of the memory device 150 may be corrected or recovered by the decoding circuitry 196 illustrated in FIG. 1 or the error correction circuitry 138 illustrated in FIG. 2, which is included in the controller 130 (Go To the step 348).

Referring to FIGS. 8 and 10, in an operation method 546 of the memory system for adjusting a level the read voltage, there is a difference in that the controller 130 may perform determining adequacy of the first reference A (step 576) when the unsatisfied check (USC) nodes are larger than the preset number of times (Sth) (Y in the step 574). As described above, the cell difference probability (CDP) may be different according to the characteristics of the non-volatile memory cells of the memory device 150 (e.g., wear, lifespan, data retention time, and etc.) or a type of the non-volatile memory cells (e.g., SLC, MLC, SLC buffering, and etc.). Therefore, in order to determine suitability of the read voltage based on the cell difference probability (CDP), the controller 130 may determine whether the first reference A compared with the cell difference probability (CDP) is appropriate based on the characteristics or operation states of the nonvolatile memory cells in the memory device 150.

When the controller 130 determines that the first reference A is not appropriate (N in the step 576), the controller 130 may perform various or more operations to recover errors in the data. According to an embodiment, when the first reference A is not appropriate, the controller 130 which searches for a new level of the read voltage may perform the operation method of the memory system to correct the error (348) illustrated in FIG. 9. Meanwhile, according to an embodiment, when the first reference A is not appropriate, the controller 130, which determines that the read voltage could be re-adjusted, may perform the step 388 of searching for the second read voltage.

On the other hand, when it is determined that the first reference A is appropriate (V in the step 576), as compared to a case where the first reference A is not appropriate, the controller 130 does not have to perform at least some processes or steps included in the method for correcting an error in the data. This is because the controller 130 does not perform a method, an operation, or etc. which is unlikely to correct an error in data, thereby reducing wasted resources in the memory system 110 and improving performance of the memory system 110. According to an embodiment, when the first reference A is appropriate, the controller 130 can perform the step 390 of performing the maximum level (Max Level) soft decision decoding or changing the table (table change) to scan and determine the distribution regarding threshold voltages of the non-volatile memory cells. The controller 130 may perform a selected or suitable decoding based on the determined information (step 392).

The adequacy of the first reference A may be determined based on an error range of the unsatisfied check (USC) nodes. The operation method 546 of the memory system for adjusting a level of the read voltage may be performed, when the cell difference probability (CDP) is less than the first reference A (Y in the step 360 of FIG. 7). When the cell difference probability (CDP) is less than the first reference A, there is an error range of the unsatisfied check (USC) nodes that can be statistically expected. When the unsatisfied check (USC) nodes is beyond the error range, the controller 130 may determine that the first reference A is not appropriate.

Although not shown, the method in which the controller 130 determines the adequacy of the first reference A for the cell difference probability (CDP) may vary. For example, the first reference A may be proportionally determined (e.g., direct proportion, exponential function proportional, or etc.) based on an increased value regarding P/E cycles that can indicate an operation state of the non-volatile memory cells in the memory device 150. The adequacy of the first reference A can be determined based on the operation state of the non-volatile memory cells in the memory device 150. In addition, according to the manufacturing characteristics of the memory device 150, when scheduled information regarding the first reference A is set in advance, the adequacy of the first reference A can be determined through comparing the current first reference A with the scheduled information for each situation regarding the first reference A.

On the other hand, in response to the adequacy of the first reference A for the cell difference probability (CDP), an operation that the controller 130 illustrated in FIG. 10 can perform is described as an example for helping understanding of an embodiment of the disclosure. An embodiment of the disclosure might not be limited to perform a specific operation for dynamically checking the adequacy of the first reference A.

In an embodiment of the disclosure, the memory system may improve efficiency of error correction and recovery. In addition, the memory system according to an embodiment of the disclosure can reduce consumption of resources used for the error correction and recovery. Further, the memory system according to an embodiment of the disclosure may improve I/O performance through the error correction and recovery.

While the present teachings have been illustrated and described with respect to the specific embodiments, it will be apparent to those skilled in the art in light of the present disclosure that various changes and modifications may be made without departing from the spirit and scope of the disclosure as defined in the following claims.

What is claimed is:

1. A memory system, comprising:
   a memory device configured to supply a read voltage into a plurality of non-volatile memory cells and output values obtained from the plurality of non-volatile memory cells; and
   a controller, coupled to the memory device via at least one channel, configured to:
   calculate cell difference probabilities (CDPs) regarding neighboring values among the values, each CDP indicating a ratio of a specific scanned value between the neighboring values, before decoding the specific scanned value, when the read voltage corresponding to the specific scanned value is applied, after a read operation to the plurality of non-volatile memory cells fails;
   determine change direction and level of the read voltage based on the cell difference probabilities (CDPs);
   adjust a level of the read voltage based on the change direction and level of the read voltage; and
   perform different types of decision decoding to recover the data stored in the plurality of non-volatile memory cells based on a comparison result of the cell difference probabilities (CDPs) and a first reference.

2. The memory system according to claim 1,
   wherein the controller is configured to perform a hard decision decoding to recover data stored in the plurality of non-volatile memory cells when one of the cell difference probabilities (CDPs) is equal to or greater than the first reference.

3. The memory system according to claim 2,
   wherein the controller is further configured to perform the soft decision decoding to recover the data stored in the plurality of non-volatile memory cells when one of the cell difference probabilities (CDPs) is less than the first reference.

4. The memory system according to claim 3,
   wherein the controller is further configured to perform the soft decision decoding on at least one of other values among the values to recover the data stored in the plurality of non-volatile memory cells, when the cell difference probability (CDP) regarding the at least one of the other values among the values outputted from the memory device after the level of read voltage is adjusted.

5. The memory system according to claim 2,
wherein the controller is further configured to increase or decrease the level of the read voltage by a preset level when a count of unsatisfied check nodes is equal to or less than a second reference.

6. The memory system according to claim 2,
wherein the controller is further configured to either perform a soft decision decoding based on a read voltage having a prescribed level or check a propriety of the first reference, when the count of unsatisfied check nodes is equal to or less than the second reference.

7. The memory system according to claim 2,
wherein one of the cell difference probabilities (CDPs) indicates whether a voltage distribution based on at least one of the values before decoding the at least one of the values falls within a range determined by a preset ratio of the maximum/minimum levels regarding a threshold voltage of each non-volatile memory cell.

8. The memory system according to claim 1,
wherein the controller is further configured to:
store a history regarding a scan operation performed after the read voltage is searched; and
compare one of the cell difference probabilities (CDPs) with a first reference based on the history.

9. The memory system according to claim 8,
wherein the controller is further configured to perform a soft decision decoding on the values before the scan operation is performed after the read voltage is searched.

10. The memory system according to claim 8,
wherein the controller is further configured to remove, in the history, a case when the read voltage is adjusted by a read retry operation.

11. A method for operating a memory system, comprising:
supplying a read voltage to a plurality of non-volatile memory cells to perform a read operation regarding values stored in the plurality of non-volatile memory cells;
calculating cell difference probabilities (CDPs) regarding neighboring values among the values read from the plurality of non-volatile memory cells, each CDP indicating a ratio of a specific scanned value, before decoding the specific scanned value, between the neighboring values when the read voltage corresponding to the specific scanned value is applied, after the read operation has failed;
determining change direction and level of the read voltage based on the cell difference probabilities (CDPs);
adjusting the read voltage based on the change direction and level of the read voltage; and
performing different types of decision decoding to recover the data stored in the plurality of non-volatile memory cells based on a comparison result of the cell difference probabilities (CDPs) and a first reference.

12. The method according to claim 11, wherein the adjusting the read voltage comprises:
performing a hard decision decoding to recover data stored in the plurality of non-volatile memory cells when one of the CDPs is equal to or larger than the first reference.

13. The method according to claim 12, wherein the adjusting the read voltage further comprises:
performing the soft decision decoding to recover the data stored in the plurality of non-volatile memory cells when one of the CDPs is less than the first reference.

14. The method according to claim 13, wherein the adjusting the read voltage further comprises:
performing the soft decision decoding on at least one of other values among the values to recover the data stored in the plurality of non-volatile memory cells, when the CDP regarding the at least one of the other values among the values outputted from the memory device after the level of read voltage is adjusted.

15. The method according to claim 12, further comprising:
increasing or decreasing the level of the read voltage by a preset level when a count of unsatisfied check nodes is equal to or less than a second reference.

16. The method according to claim 15, further comprising:
when the count of unsatisfied check nodes is equal to or less than the second reference, either performing a soft decision decoding based on a read voltage having a prescribed level or checking a propriety of the first reference.

17. The method according to claim 11,
wherein one of the CDPs indicates whether a voltage distribution based on at least one of the values before decoding the at least one of the values falls within a range determined by a preset ratio of the maximum/minimum levels regarding a threshold voltage of each non-volatile memory cell.

18. The method according to claim 11, further comprising:
storing a history regarding a scan operation performed after the read voltage is searched; and
comparing one of the CDPs with a first reference based on the history.

19. The method according to claim 18, further comprising:
performing a soft decision decoding on the values before the scan operation is performed after the read voltage is searched.

20. The method according to claim 18, further comprising:
removing, in the history, a case where the read voltage is adjusted by a read retry operation.

* * * * *